(12) United States Patent
Philipp et al.

(10) Patent No.: US 7,869,257 B2
(45) Date of Patent: Jan. 11, 2011

(54) INTEGRATED CIRCUIT INCLUDING DIODE MEMORY CELLS

(75) Inventors: Jan Boris Philipp, Munich (DE);
Thomas Happ, Dresden (DE)

(73) Assignee: Qimonda AG, München (DE)

( * ) Notice: Subject to any disclaimer, the term of this patent is extended or adjusted under 35 U.S.C. 154(b) by 159 days.

(21) Appl. No.: 11/957,964

(22) Filed: Dec. 17, 2007

(65) Prior Publication Data
US 2009/0154227 A1   Jun. 18, 2009

(51) Int. Cl.
*G11C 11/00* (2006.01)
*G11C 11/14* (2006.01)

(52) U.S. Cl. ............... 365/148; 365/158; 365/163; 365/171; 365/173; 365/175

(58) Field of Classification Search ............ 365/148, 365/158, 163, 171, 175, 173
See application file for complete search history.

(56) References Cited

U.S. PATENT DOCUMENTS

| | | | | |
|---|---|---|---|---|
| 6,731,535 B1 * | 5/2004 | Ooishi et al. ............ | 365/175 |
| 7,248,494 B2 * | 7/2007 | Oh et al. .................. | 365/163 |
| 7,405,965 B2 * | 7/2008 | Choi et al. ............... | 365/163 |
| 7,436,693 B2 * | 10/2008 | Kang et al. .............. | 365/148 |
| 7,447,062 B2 * | 11/2008 | Burr et al. ............... | 365/163 |
| 7,460,386 B2 * | 12/2008 | Cho et al. ................ | 365/163 |
| 7,466,584 B1 * | 12/2008 | Parkinson et al. ........ | 365/163 |
| 7,548,446 B2 * | 6/2009 | Kim et al. ................ | 365/148 |
| 7,548,467 B2 * | 6/2009 | Kim et al. ................ | 365/148 |
| 7,558,100 B2 * | 7/2009 | Ahn et al. ................ | 365/148 |
| 7,570,511 B2 * | 8/2009 | Cho et al. ................ | 365/163 |
| 7,599,217 B2 * | 10/2009 | Lai et al. ................. | 365/163 |
| 2003/0001230 A1 | 1/2003 | Lowrey | |
| 2004/0256610 A1 | 12/2004 | Lung | |
| 2006/0120148 A1 | 6/2006 | Kim et al. | |
| 2006/0197115 A1 | 9/2006 | Toda | |
| 2006/0203541 A1 | 9/2006 | Toda | |

\* cited by examiner

*Primary Examiner*—Trong Phan
(74) *Attorney, Agent, or Firm*—Coats & Bennett, P.L.L.C.

(57) ABSTRACT

The integrated circuit includes a transistor and a contact coupled to the transistor. The integrated circuit includes a first diode resistivity changing material memory cell coupled to the contact and a second diode resistivity changing material memory cell coupled to the contact. The second diode resistivity changing material memory cell is positioned above the first diode resistivity changing material memory cell.

27 Claims, 16 Drawing Sheets

INTEGRATED CIRCUIT INCLUDING DIODE MEMORY CELLS

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

Higher density phase change memories can also be achieved by reducing the physical size of each memory cell. Increasing the density of a phase change memory increases the amount of data that can be stored within the memory while at the same time typically reducing the cost of the memory.

For these and other reasons, there is a need for the present invention.

SUMMARY

One embodiment provides an integrated circuit. The integrated circuit includes a transistor and a contact coupled to the transistor. The integrated circuit includes a first diode resistivity changing material memory cell coupled to the contact and a second diode resistivity changing material memory cell coupled to the contact. The second diode resistivity changing material memory cell is positioned above the first diode resistivity changing material memory cell.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
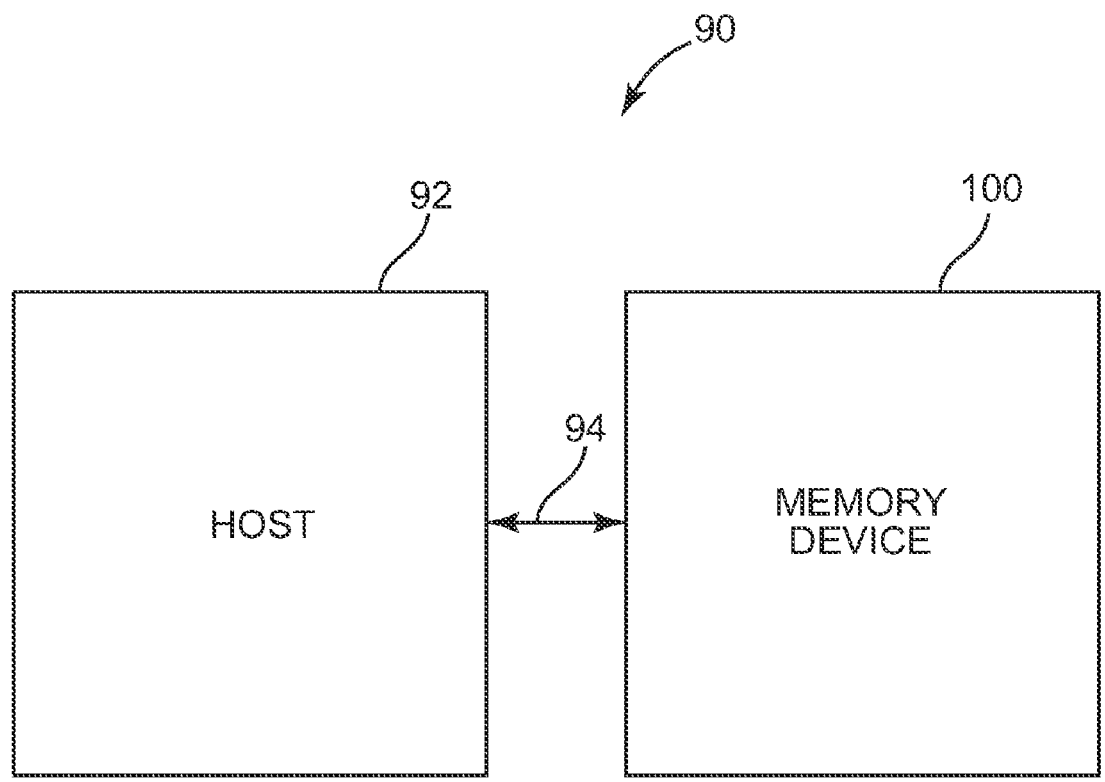
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
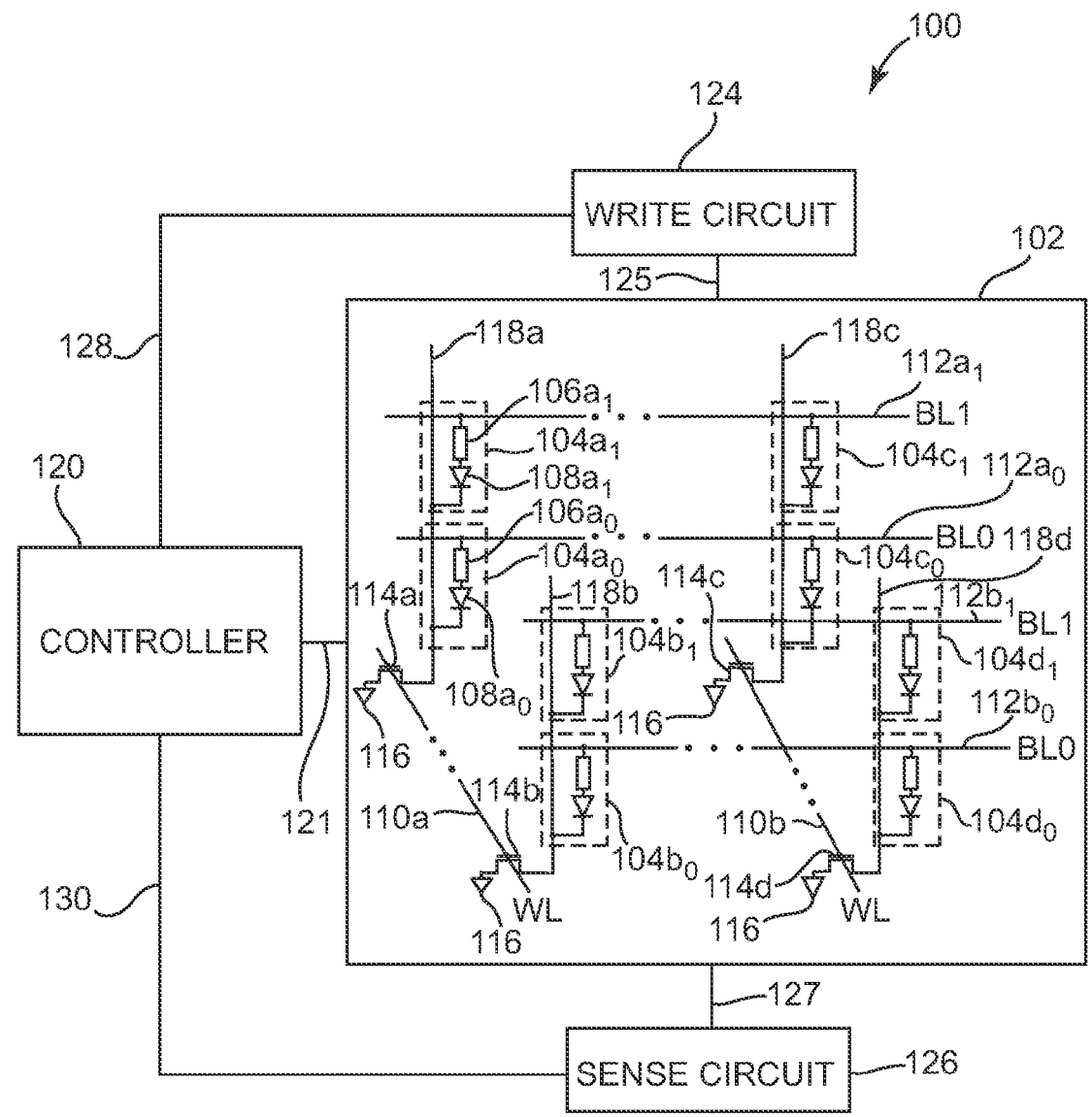
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes a write circuit 124, a controller 120, a memory array 102, and a sense circuit 126. Memory array 102 includes a plurality of transistors 114a-114d (collectively referred to as transistors 114), a plurality of diode resistive memory cells $104a_{0-1}$-$104d_{0-1}$ (collectively referred to as diode resistive memory cells 104), a plurality of bit lines (BL0, BL1 ... BLn) $112a_{0-1}$-$112b_{0-1}$ (collectively referred to as bit lines 112), and a plurality of word lines (WLs) 110a-110b (collectively referred to as word lines 110). In one embodiment, diode resistive memory cells 104 are diode phase change memory cells. In other embodiments, diode resistive memory cells 104 are another suitable type of diode resistive memory cells or resistivity changing material memory cells.

Memory array 102 includes a three dimensional array of diode phase change memory cells 104. In one embodiment, memory array 102 includes two layers of diode phase change memory cells 104 stacked over an array of transistors 114. In other embodiments, any suitable number, such as 3, 4, or more layers of diode phase change memory cells 104 can be stacked over the array of transistors 114. Each transistor 114 can access the diode phase change memory cells 104 stacked over the transistor through a vertical contact.

As used herein, the term "electrically coupled" is not meant to mean that the elements must be directly coupled together and intervening elements may be provided between the "electrically coupled" elements.

Memory array 102 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. One side of the source-drain path of each transistor 114 is electrically coupled to a common or ground 116. In one embodiment, common or ground 116 is a plate. In other embodiments, common or ground 116 includes common or ground lines or another suitable configuration. The gate of each transistor 114 is electrically coupled to a word line 110. The gates of transistors 114a and 114b are electrically coupled to word line 110a, and the gates of transistors 114c and 114d are electrically coupled to word line 110b. While transistors 114 are field-effect transistors (FETs) in the illustrated embodiment, in other embodiments, transistors 114 can be other suitable devices such as a bipolar transistors or 3D transistor structures.

Each diode phase change memory cell 104 is electrically coupled to a transistor 114 and a bit line 112. Diode phase change memory cell $104a_0$ is electrically coupled to bit line $112a_0$ and the other side of the source-drain path of transistor 114a through vertical contact 118a, and diode phase change memory cell $104a_1$ is electrically coupled to bit line $112a_1$ and the other side of the source-drain path of transistor 114a through vertical contact 118a. Diode phase change memory cell $104b_0$ is electrically coupled to bit line $112b_0$ and the other side of the source-drain path of transistor $114b$ through vertical contact $118b$, and diode phase change memory cell $104b_1$ is electrically coupled to bit line $112b_1$ and the other side of the source-drain path of transistor $114b$ through vertical contact $118b$. Diode phase change memory cell $104c_0$ is electrically coupled to bit line $112a_0$ and the other side of the source-drain path of transistor $114c$ through vertical contact $118c$, and diode phase change memory cell $104c_1$ is electrically coupled to bit line $112a_1$ and the other side of the source-drain path of transistor $114c$ through vertical contact $118c$. Diode phase change memory cell $104d_0$ is electrically coupled to bit line $112b_0$ and the other side of the source-drain path of transistor $114d$ through vertical contact $118d$, and diode phase change memory cell $104d_1$ is electrically coupled to bit line $112b_1$ and the other side of the source-drain path of transistor $114d$ through vertical contact $118d$.

Each diode phase change memory cell 104 includes a phase change element 106 and a diode 108. In one embodiment, the polarity of diodes 108 is reversed. For example, diode phase change memory cell $104a_0$ includes phase change element $106a_0$ and diode $108a_0$. One side of phase change element $106a_0$ is electrically coupled to bit line $112a_0$, and the other side of phase change element $106a_0$ is electrically coupled to one side of diode $108a_0$. The other side of diode $108a_0$ is electrically coupled to vertical contact $118a$. Diode phase change memory cell $104a_1$ includes phase change element $106a_1$ and diode $108a_1$. One side of phase change element $106a_1$ is electrically coupled to bit line $112a_1$, and the other side of phase change element $106a_1$ is electrically coupled to one side of diode $108a_1$. The other side of diode $108a_1$, is electrically coupled to vertical contact $118a$.

In another embodiment, each phase change element 106 is electrically coupled to a vertical contact 118 and each diode 108 is electrically coupled to a bit line 112. For example, for diode phase change memory cell $104a_0$, one side of phase change element $106a_0$ is electrically coupled to vertical contact $118a$. The other side of phase change element $106a_0$ is electrically coupled to one side of diode $108a_0$. The other side of diode $108a_0$ is electrically coupled to bit line $112a_0$.

In one embodiment, each phase change element 106 includes a phase change material that may be made up of a variety of materials in accordance with the present invention. Generally, chalcogenide alloys that contain one or more elements from Group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106 thereby defines two or more states for storing data within memory device 100. In the amorphous state, a phase change material exhibits significantly higher resistivity than in the crystalline state. Therefore, the two or more states of the phase change elements differ in their electrical resistivity. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that are assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 102 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

In one embodiment, during a "set" operation of diode phase change memory cell $104a_0$, word line $110a$ is selected to activate transistor $114a$. With transistor $114a$ activated, a set current or voltage pulse is selectively enabled by write circuit 124 and sent through bit line $112a_0$ to phase change element $106a_0$ thereby heating phase change element $106a_0$ above its crystallization temperature (but usually below its melting temperature). In this way, phase change element $106a_0$ reaches the crystalline state or a partially crystalline and partially amorphous state during this set operation.

During a "reset" operation of diode phase change memory cell $104a_0$, word line $110a$ is selected to activate transistor $114a$. With transistor $114a$ activated, a reset current or voltage pulse is selectively enabled by write circuit 124 and sent through bit line $112a_0$ to phase change element $106a_0$. The reset current or voltage quickly heats phase change element $106a_0$ above its melting temperature. After the current or voltage pulse is turned off, phase change element $106a_0$ quickly quench cools into the amorphous state or a partially amorphous and partially crystalline state.

Diode phase change memory cells $104a_1$, $104b_{0-1}$-$104d_{0-1}$, and other diode phase change memory cells 104 in memory array 102 are set and reset similarly to diode phase change memory cell $104a_0$ using a similar current or voltage pulse. In other embodiments, for other types of resistive memory cells, write circuit 124 provides suitable programming pulses to program the resistive memory cells 104 to the desired state.

Figure 3A:
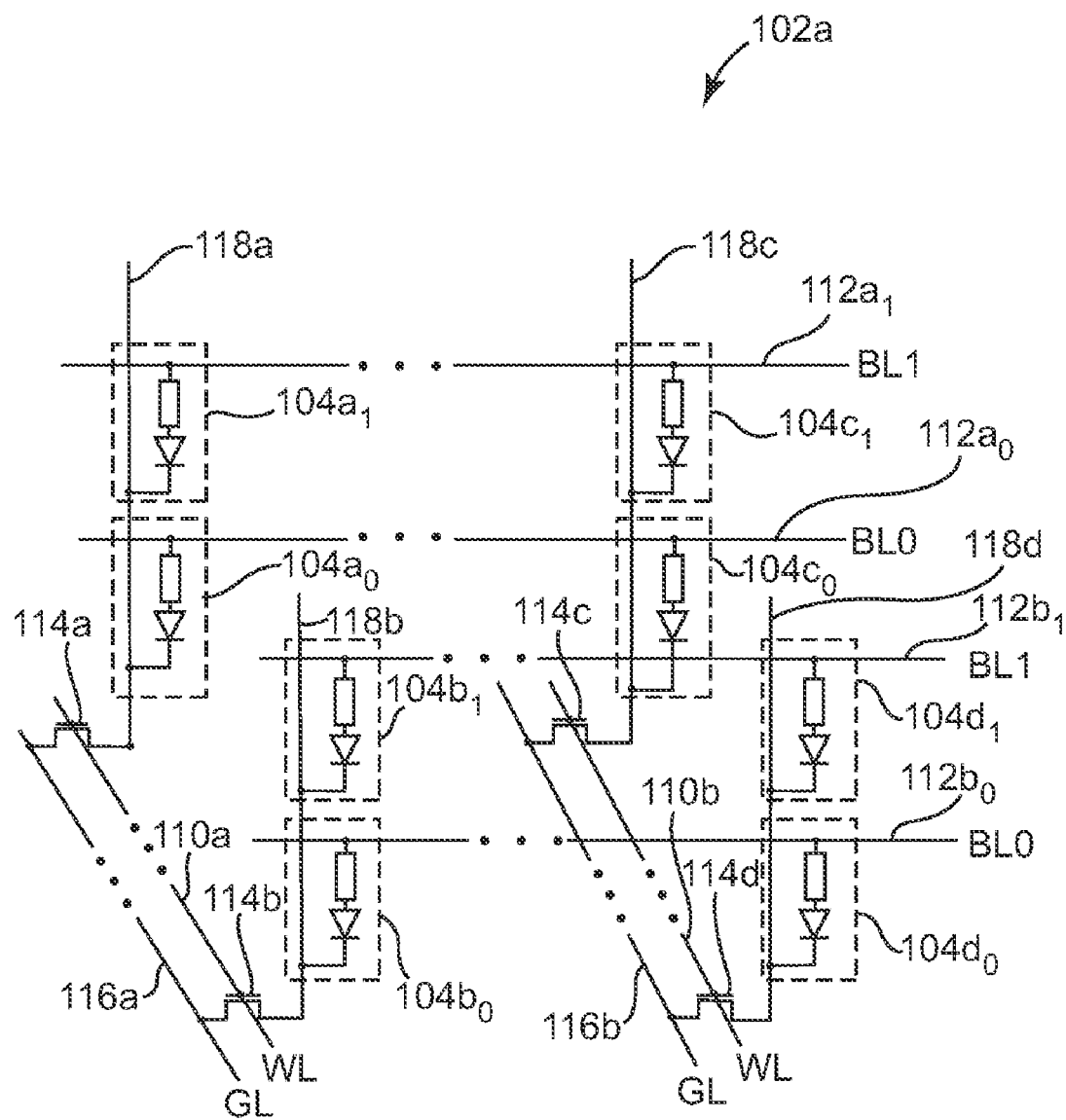
FIG. 3A illustrates a perspective view of one embodiment of a memory array.

FIG. 3A illustrates a perspective view of one embodiment of a memory array $102a$. In one embodiment, memory array $102a$ is used in place of memory array 102. Memory array $102a$ is similar to memory array 102 previously described and illustrated with reference to FIG. 2, except that memory array $102a$ includes common or ground lines (GLs) $116a$-$116b$. Ground line $116a$ is electrically coupled to one side of the source-drain path of transistors $114a$ and $114b$. Ground line 116*b* is electrically coupled to one side of the source-drain path of transistors 114*c* and 114*d*. In this embodiment, ground lines 116*a*-116*b* are parallel to word lines 110 and perpendicular to bit lines 112.

Figure 3B:
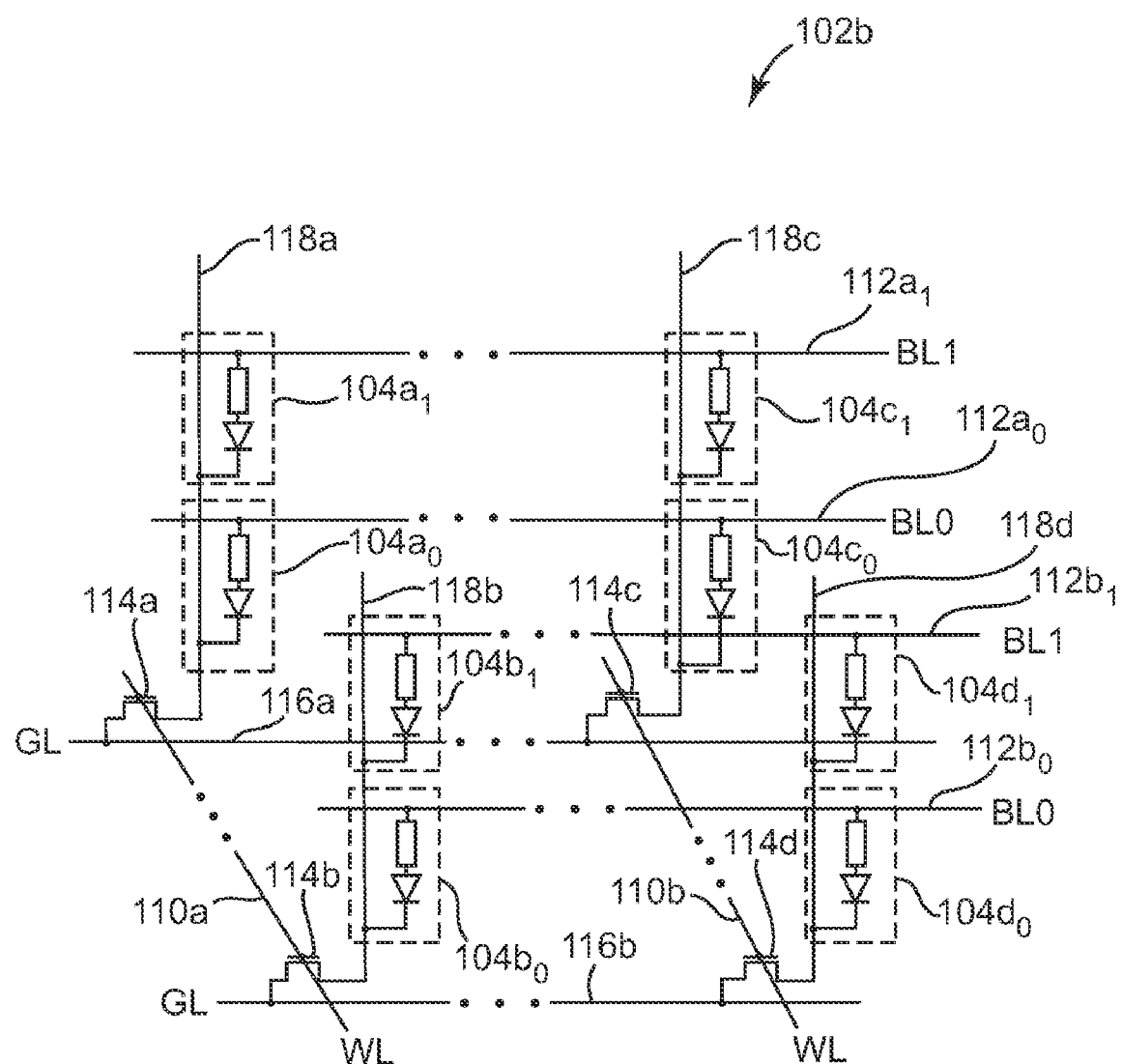
FIG. 3B illustrates a perspective view of another embodiment of a memory array.

FIG. 3B illustrates a perspective view of another embodiment of a memory array 102*b*. In one embodiment, memory array 102*b* is used in place of memory array 102. Memory array 102*b* is similar to memory array 102 previously described and illustrated with reference to FIG. 2, except that memory array 102*b* includes common or ground lines (GLs) 116*a*-116*b*. Ground line 116*a* is electrically coupled to one side of the source-drain path of transistors 114*a* and 114*c*. Ground line 116*b* is electrically coupled to one side of the source-drain path of transistors 114*b* and 114*d*. In this embodiment, ground lines 116*a*-116*b* are perpendicular to word lines 110 and parallel to bit lines 112.

Figure 3C:
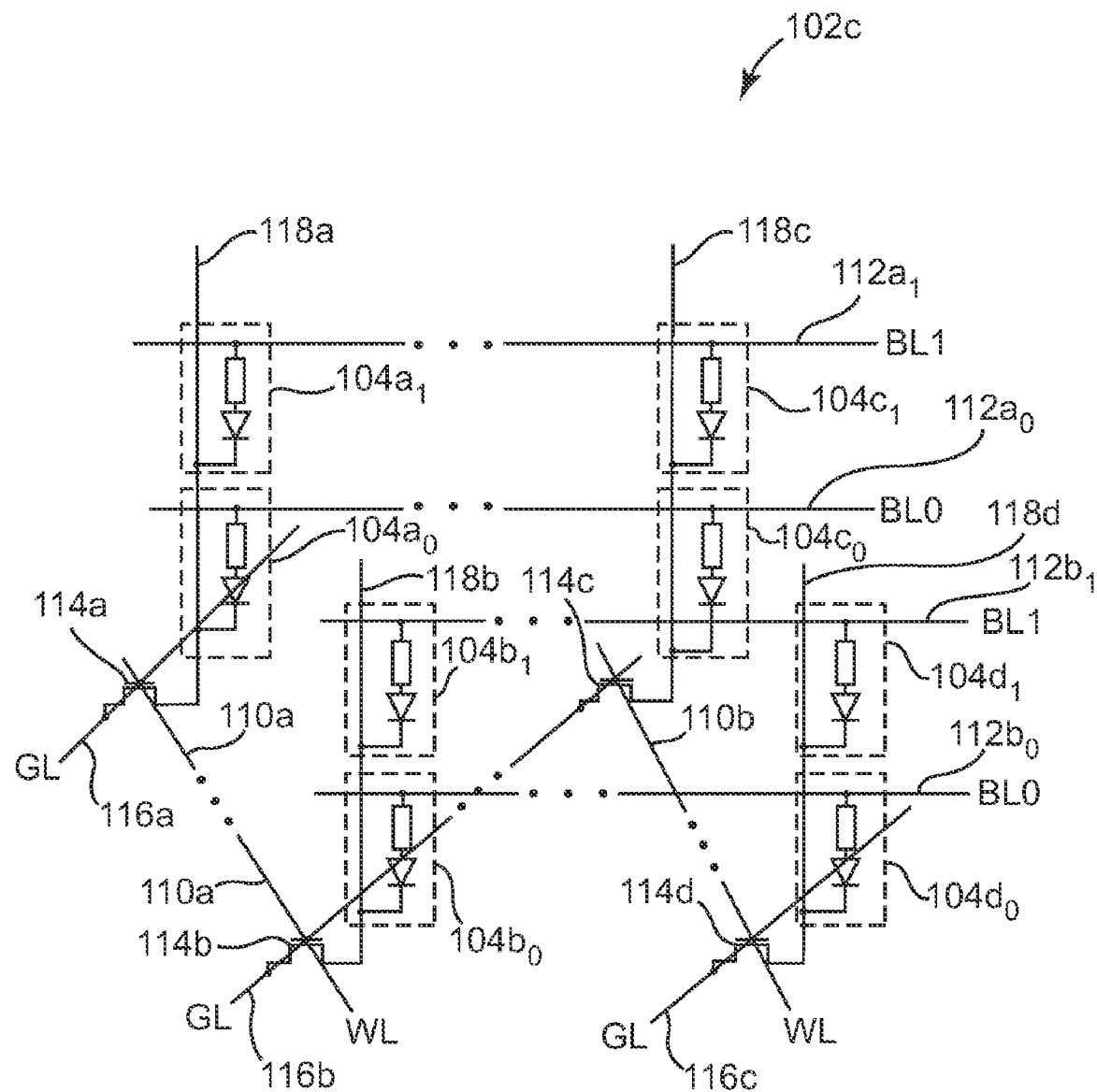
FIG. 3C illustrates a perspective view of another embodiment of a memory array.

FIG. 3C illustrates a perspective view of another embodiment of a memory array 102*c*. In one embodiment, memory array 102*c* is used in place of memory array 102. Memory array 102*c* is similar to memory array 102 previously described and illustrated with reference to FIG. 2, except that memory array 102*c* includes common or ground lines (GLs) 116*a*-116*c*. Ground line 116*a* is electrically coupled to one side of the source-drain path of transistor 114*a*. Ground line 116*b* is electrically coupled to one side of the source-drain path of transistors 114*b* and 114*c*. Ground line 116*c* is electrically coupled to one side of the source-drain path of transistor 114*d*. In this embodiment, ground lines 116*a*-116*c* are diagonal to word lines 110 and bit lines 112.

Figure 4A:
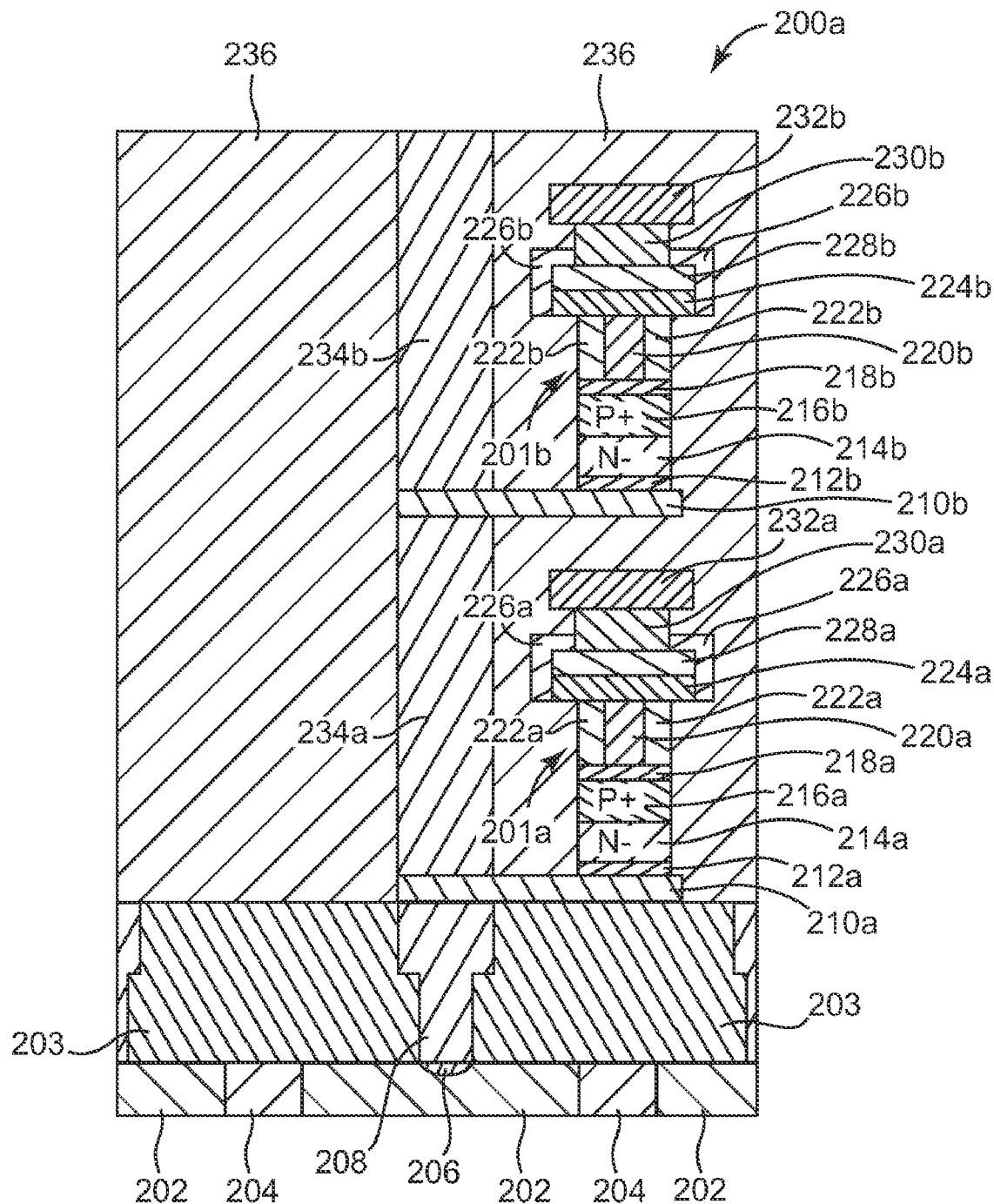
FIG. 4A illustrates a cross-sectional view of one embodiment of stacked diode memory cells.

FIG. 4A illustrates a cross-sectional view of one embodiment of stacked diode memory cells 200*a*. In one embodiment, each stack of diode memory cells such as diode memory cells 104$a_0$ and 104$a_1$ are similar to stacked diode memory cells 200*a*. While stacked diode memory cells 200*a* includes two stacked diode memory cells, in other embodiments any suitable number of diode memory cells can be stacked. Stacked diode memory cells 200*a* includes a substrate 202, shallow trench isolation (STI) 204 or other suitable isolation, transistors (not shown) including a source/drain region 206, a contact 208, and dielectric material 203. Stacked diode memory cells 200*a* also includes a first metal pad 210*a*, a first diode phase change memory cell 201*a*, a first bit line 232*a*, a first vertical contact 234*a*, a second metal pad 210*b*, a second diode phase change memory cell 201*b*, a second bit line 232*b*, a second vertical contact 234*b*, and dielectric material 236.

First diode phase change memory cell 201*a* includes a first silicide contact 212*a*, an N– region 214*a*, a P+ region 216*a*, a second silicide contact 218*a*, a bottom electrode 220*a*, spacers 222*a*, a phase change material storage location 224*a*, a top electrode 228*a*, encapsulation material 226*a*, and a bit line contact 230*a*. P+ region 216*a* and N– region 214*a* form a diode 108. In another embodiment, the polarity of diode 108 and the associated dopings are reversed. Second diode phase change memory cell 201*b* includes a first silicide contact 212*b*, an N– region 214*b*, a P+ region 216*b*, a second silicide contact 218*b*, a bottom electrode 220*b*, spacers 222*b*, a phase change material storage location 224*b*, a top electrode 228*b*, encapsulation material 226*b*, and a bit line contact 230*b*. P+ region 216*b* and N– region 214*b* form a diode 108. In another embodiment, the polarity of diode 108 and the associated dopings are reversed.

Transistors, such as transistors 114, are formed in substrate 202 and include source/drain region 206. Substrate 202 includes a Si substrate or another suitable substrate. STI 204 electrically isolates adjacent transistors from each other. Source/drain region 206 contacts contact 208. Contact 208 includes W, Al, Cu, or other suitable material. Contact 208 is laterally surrounded by dielectric material 203. Dielectric material 203 includes $SiO_2$, $SiO_x$, SiN, fluorinated silica glass (FSG), boro-phosphorous silicate glass (BPSG), boro-silicate glass (BSG), or other suitable dielectric material. Contact 208 contacts a portion of the bottom of first metal pad 210*a*. First metal pad 210*a* includes W, Al, Cu, or other suitable metal.

A portion of the top of first metal pad 210*a* contacts the bottom of first silicide contact 212*a*. First silicide contact 212*a* includes CoSi, TiSi, NiSi, TaSi, or other suitable silicide. The top of first silicide contacts 212*a* contacts the bottom of N– region 214*a*. In one embodiment, N– region 214*a* includes doped polysilicon. The top of N– region 214*a* contacts the bottom of P+ region 216*a*. In one embodiment, P+ region 216*a* includes doped polysilicon. The top of P+ region 216*a* contacts the bottom of second silicide contact 218*a*. Second silicide contact 218*a* includes CoSi, TiSi, NiSi, TaSi, or other suitable silicide.

The top of second silicide contact 218*a* contacts the bottom of spacers 222*a* and the bottom of bottom electrode 220*a*. Spacers 222*a* include SiN, $SiO_2$, $SiO_xN$, $TaO_x$, $Al_2O_3$, or other suitable spacer material. Spacers 222*a* laterally enclose bottom electrode 220*a*. Bottom electrode 220*a* includes TiN, TaN, W, WN, Al, C, Ti, Ta, TiSiN, TaSiN, TiAlN, TaAlN, Cu, or other suitable electrode material. The top of spacers 222*a* and the top of bottom electrode 220*a* contact the bottom of phase change material storage location 224*a*. Phase change material storage location 224*a* provides a storage location for storing one or more bits of data. The active or phase change region of phase change material storage location 224*a* is at or close to the interface between phase change material storage location 224*a* and bottom electrode 220*a*. In one embodiment, the cross-sectional width of phase change material storage location 224*a* is greater than the cross-sectional width of bottom electrode 220*a*.

The top of phase change material storage location 224*a* contacts the bottom of top electrode 228*a*. Top electrode 228*a* includes TiN, TaN, W, WN, Al, C, Ti, Ta, TiSiN, TaSiN, TiAlN, TaAlN, Cu, or other suitable electrode material. Encapsulation material 226*a* encapsulates phase change material storage location 224*a* and top electrode 228*a*. Encapsulation material 226*a* includes SiN, SiON, $TaO_x$, $Al_2O_3$, or other suitable encapsulation material. In one embodiment, more than one layer of encapsulation material encapsulates phase change material storage location 224*a* and top electrode 228*a*.

The top of top electrode 228*a* contacts the bottom of bit line contact 230*a*. Bit line contact 230*a* includes W, Al, Cu, or other suitable material. The top of bit line contact 230*a* contacts the bottom of bit line 232*a*. Bit line 232*a* includes W, Al, Cu, or other suitable material. Bit line 232*a* contacts two or more bit line contacts 230*a* along a row or column of memory array 102.

A portion of the top of first metal pad 210*a* contacts the bottom of first vertical contact 234*a*. First vertical contact 234*a* includes W, Al, Cu, or other suitable material. The top of first vertical contact 234*a* contacts a portion of the bottom of second metal pad 210*b*. Second metal pad 210*b* is similar to first metal pad 210*a*. The elements of diode phase change memory cell 201*b*, including 212*b*, 214*b*, 216*b*, 218*b*, 220*b*, 222*b*, 224*b*, 228*b*, 226*b*, 228*b*, and 230*b*, are similar to and configured similarly to the corresponding elements previously described for diode phase change memory cell 201*a*. Bit line 232*b* is similar to bit line 232*a*.

A portion of the top of second metal pad 210*b* contacts the bottom of second vertical contact 234*b*. Second vertical contact 234b is similar to first vertical contact 234a. Any suitable number of additional metal pads and diode phase change memory cells can be provided above second vertical contact 234b. Dielectric material 236 surrounds metal pads 210a and 210b, vertical contacts 234a and 234b, diode phase change memory cells 201a and 201b, and bit lines 232a and 232b.

The current path through diode phase change memory cell 201a is from bit line contact 230a through top electrode 228a and phase change material storage location 224a to bottom electrode 220a. From bottom electrode 220a, the current flows through second silicide contact 218a and the diode formed by P+ region 216a and N− region 214a. From N− region 214a the current flows through first silicide contact 212a and first metal pad 210a to vertical contact 234a. The cross-sectional width of the interface area between phase change material storage location 224a and bottom electrode 220a defines the current density through the interface and thus the power used to program memory cell 201a. By reducing the cross-sectional width of the interface area, the current density is increased, thus reducing the power used to program memory cell 201a.

During operation of memory cell 201a, current or voltage pulses are applied between top electrode 226a and first metal pad 210a to program memory cell 201a. During a set operation of memory cell 201a, a set current or voltage pulse is selectively enabled by write circuit 124 and sent through bit line 232a and bit line contact 230a to top electrode 228a. From top electrode 228a, the set current or voltage pulse passes through phase change material storage location 224a thereby heating the phase change material above its crystallization temperature (but usually below its melting temperature). In this way, the phase change material reaches a crystalline state or a partially crystalline and partially amorphous state during the set operation.

During a reset operation of memory cell 201a, a reset current or voltage pulse is selectively enabled by write circuit 124 and sent through bit line 232a and bit line contact 230a to top electrode 228a. From top electrode 228a, the reset current or voltage pulse passes through phase change material storage location 224a. The reset current or voltage quickly heats the phase change material above its melting temperature. After the current or voltage pulse is turned off, the phase change material quickly quench cools into an amorphous state or a partially amorphous and partially crystalline state.

The current path through diode phase change memory cell 201b is similar to the current path through diode phase change memory cell 201a except that bit line 232b and second metal pad 210b are used for diode phase change memory cell 201b. Diode phase change memory cell 201b is programmed similarly to diode phase change memory cell 201a.

Figure 4B:
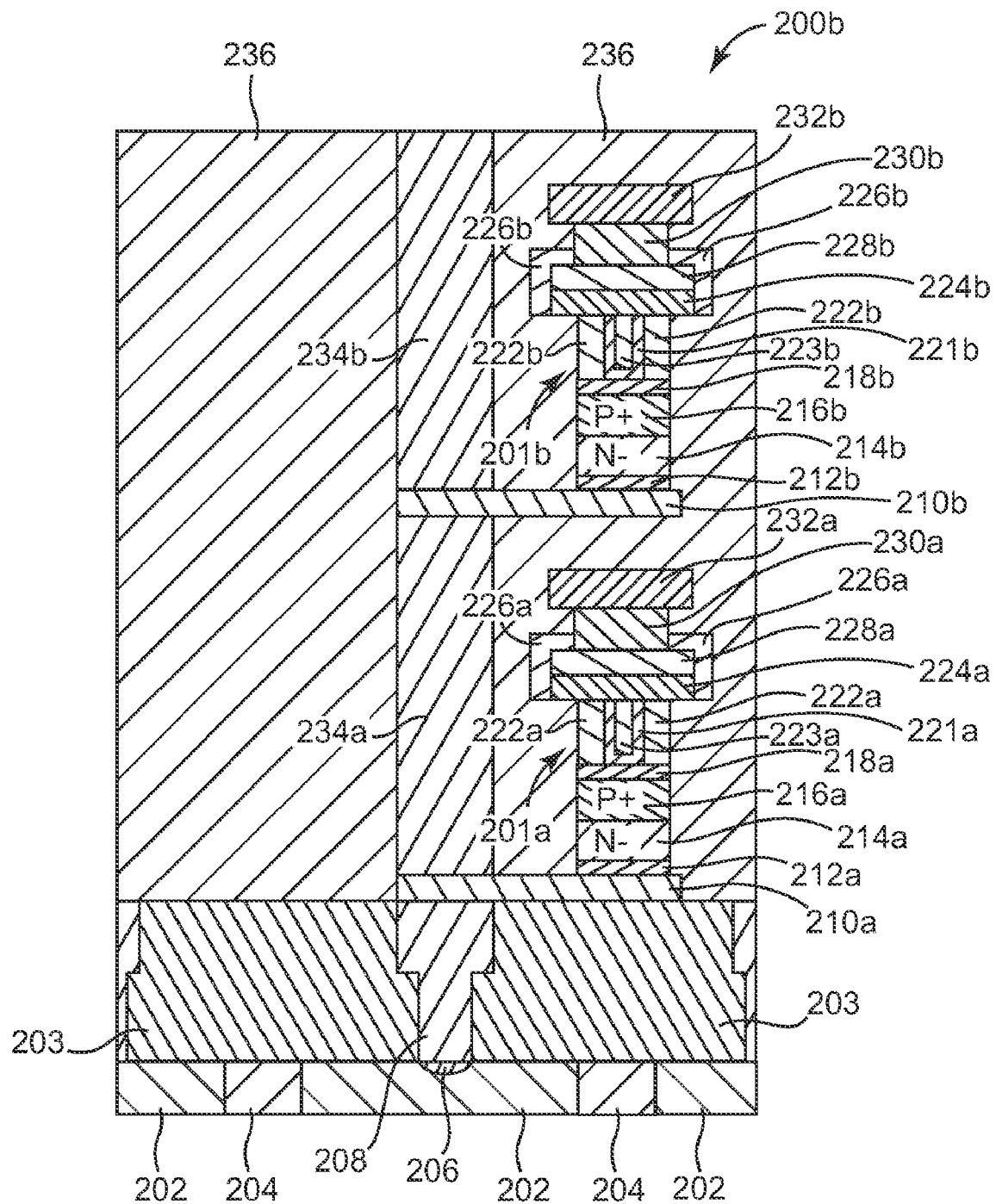
FIG. 4B illustrates a cross-sectional view of another embodiment of stacked diode memory cells.

FIG. 4B illustrates a cross-sectional view of another embodiment of stacked diode memory cells 200b. In one embodiment, each stack of diode memory cells such as diode memory cells $104a_0$ and $104a_1$ are similar to stacked diode memory cells 200b. Stacked diode memory cells 200b are similar to stacked diode memory cells 200a previously described and illustrated with reference to FIG. 4A, except that in memory cells 201a and 201b bottom electrodes 220a and 220b and replaced with bottom electrodes 221a and 221b.

In this embodiment, bottom electrodes 221a and 221b are ring shaped or U-shaped electrodes. The inner surface of bottom electrodes 221a and 221b contacts semiconducting or dielectric material 223a and 223b, respectively. Semiconducting or dielectric material 223a and 223b includes Si, SiN, $SiO_2$, $SiO_xN$, $TaO_x$, $Al_2O_3$, or other suitable semiconducting or dielectric material. In this embodiment, the interface area between bottom electrodes 221a and 221b and phase change material storage locations 224a and 224b, respectively, is further reduced. The reduced interface area provides a higher current density and thus reduces the current used to program memory cells 201a and 201b. Memory cells 201a and 201b of stacked diode memory cells 200b are programmed similarly to memory cells 201a and 201b of stacked diode memory cells 200a previously described and illustrated with reference to FIG. 4A.

Figure 4C:
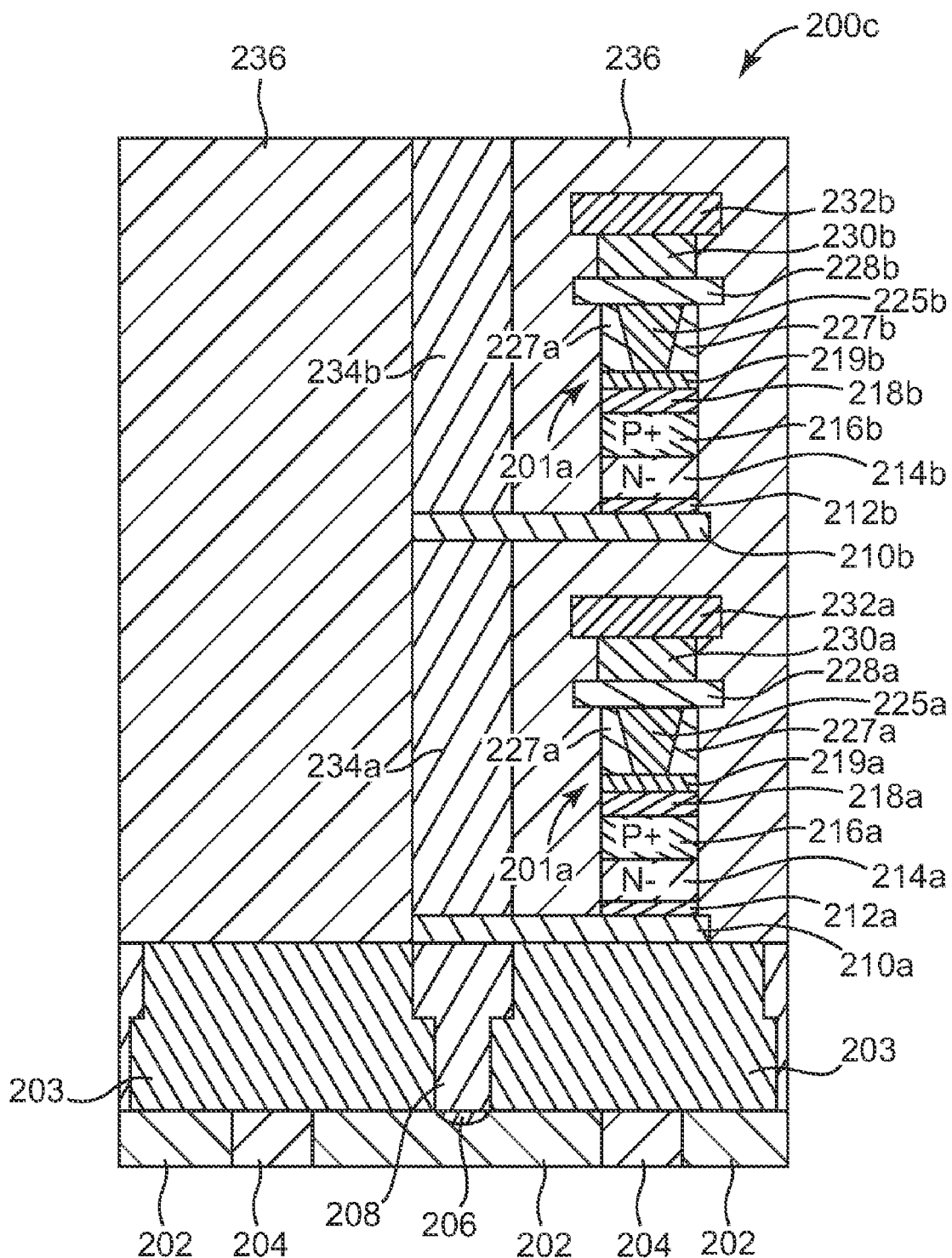
FIG. 4C illustrates a cross-sectional view of another embodiment of stacked diode memory cells.

FIG. 4C illustrates a cross-sectional view of another embodiment of stacked diode memory cells 200c. In one embodiment, each stack of diode memory cells such as diode memory cells $104a_0$ and $104a_1$ are similar to stacked diode memory cells 200c. Stacked diode memory cells 200c are similar to stacked diode memory cells 200a previously described and illustrated with reference to FIG. 4A, except that in memory cells 201a and 201b bottom electrodes 220a and 220b and replaced with bottom electrodes 219a and 219b, spacers 222a and 222b are replaced with dielectric material 227a and 227b, and phase change material storage locations 224a and 224b are replaced with phase change material storage locations 225a and 225b.

In this embodiment, bottom electrodes 219a and 219b have the same cross-sectional width as second silicide contacts 218a and 218b. Phase change material storage locations 225a and 225b have tapered sidewalls defined by dielectric material 227a and 227b, respectively. Dielectric material 227a and 227b includes SiN, $SiO_2$, $SiO_xN$, $TaO_x$, $Al_2O_3$, or other suitable dielectric material. The tapered phase change material storage locations 225a and 225b reduce the interface area between phase change material storage locations 225a and 225b and bottom electrodes 219a and 219b, respectively. The reduced interface area provides a higher current density and thus reduces the current used to program memory cells 201a and 201b. Memory cells 201a and 201b of stacked diode memory cells 200c are programmed similarly to memory cells 201a and 201b of stacked diode memory cells 200a previously described and illustrated with reference to FIG. 4A.

The following FIGS. 5A-16 illustrate embodiments for fabricating an array of stacked diode phase change memory cells, such as stacked diode phase change memory cells 200a-200c previously described and illustrated with reference to FIG. 4A-4C.

Figure 5A:
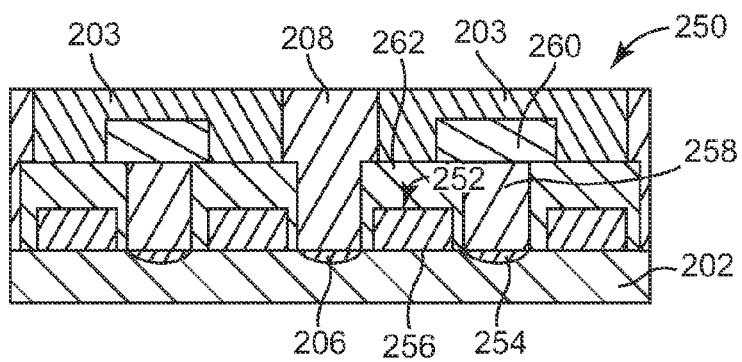
FIG. 5A illustrates a cross-sectional view of one embodiment of a preprocessed wafer.
Figure 5B:
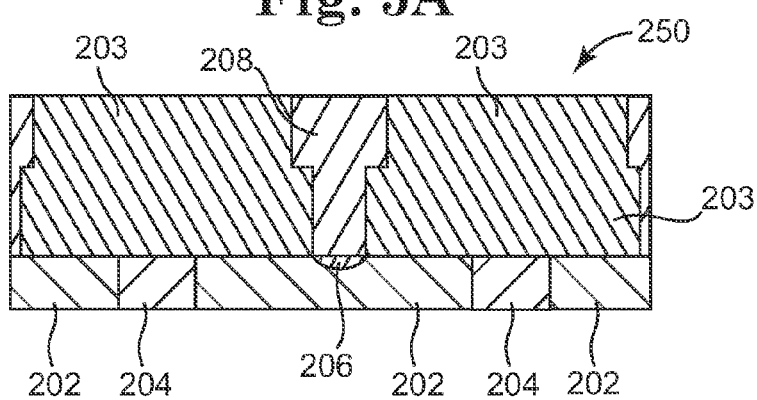
FIG. 5B illustrates a cross-sectional view of one embodiment of the preprocessed wafer perpendicular to the view illustrated in FIG. 5A.

FIG. 5A illustrates a cross-sectional view of one embodiment of a preprocessed wafer 250, and FIG. 5B illustrates a cross-sectional view of preprocessed wafer 250 perpendicular to the view illustrated in FIG. 5A. Preprocessed wafer 250 includes a substrate 202, STI 204, a transistor 252, contacts 208 and 258, a ground line 260, and dielectric material 203 and 262. Transistor 252 includes source/drain regions 206 and 254 and a gate 256. In one embodiment, each transistor 114 is similar to transistor 252. Gate 256 of transistor 252 is electrically coupled to a word line 110, which comprises doped poly-Si, W, TiN, NiSi, CoSi, TiSi, $WSi_x$, or other suitable material.

Transistor 252 is formed in substrate 202. STI 204 electrically isolates adjacent transistors from each other. Source/drain region 206 of transistor 252 contacts the bottom of contact 208. Source/drain region 254 of transistor 252 contacts the bottom of contact 258. Contact 258 includes W, Al, Cu, or other suitable material. The top of contact 258 contacts the bottom of ground line 260. Ground line 260 includes W, Al, Cu, or other suitable material. Dielectric material 262 surrounds gate 256 of transistor 252. Dielectric material 262 includes SiN, $SiO_2$, $SiO_xN$, $TaO_x$, $Al_2O_3$, or other suitable dielectric material. Dielectric material 203 surrounds contact 208 and ground line 260.

Figure 6A:
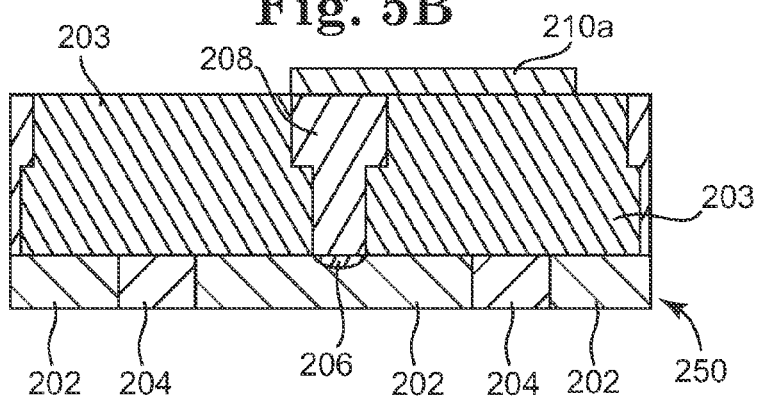
FIG. 6A illustrates a cross-sectional view of one embodiment of the preprocessed wafer and a metal pad.

FIG. 6A illustrates a cross-sectional view of one embodiment of preprocessed wafer 250 and a metal pad 210a. A metal, such as W, Al, Cu, or other suitable metal is deposited over preprocessed wafer 250 to provide a metal layer. The metal layer is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique. The metal layer is then etched to expose portions of preprocessed wafer 250 and to provide metal pad 210a. Metal pad 210a contacts contact 208.

Figure 6B:
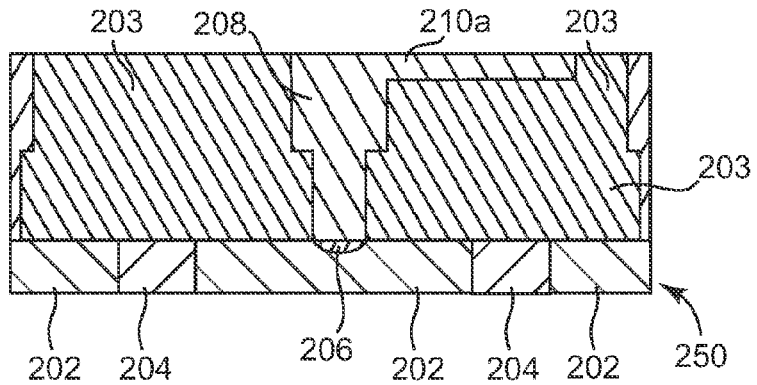
FIG. 6B illustrates a cross-sectional view of another embodiment of the preprocessed wafer and a metal pad.

FIG. 6B illustrates a cross-sectional view of another embodiment of preprocessed wafer 250 and metal pad 210a. In this embodiment, a dual damascene process is used to provide metal pad 210a and at least a portion of contact 208. Dielectric material 203 is etched to provide openings for contact 208 and metal pad 210a. A metal, such as W, Al, Cu, or other suitable metal is deposited over preprocessed wafer 250 and in the openings to provide a metal layer. The metal layer is deposited using CVD, HDP-CVD, ALD, MOCVD, PVD, JVD, or other suitable deposition technique. The metal layer is then planarized to expose dielectric material 203 and to provide contact 208 and metal pad 210a. The metal layer is planarized using chemical mechanical planarization (CMP) or another suitable planarization technique.

Figure 7:
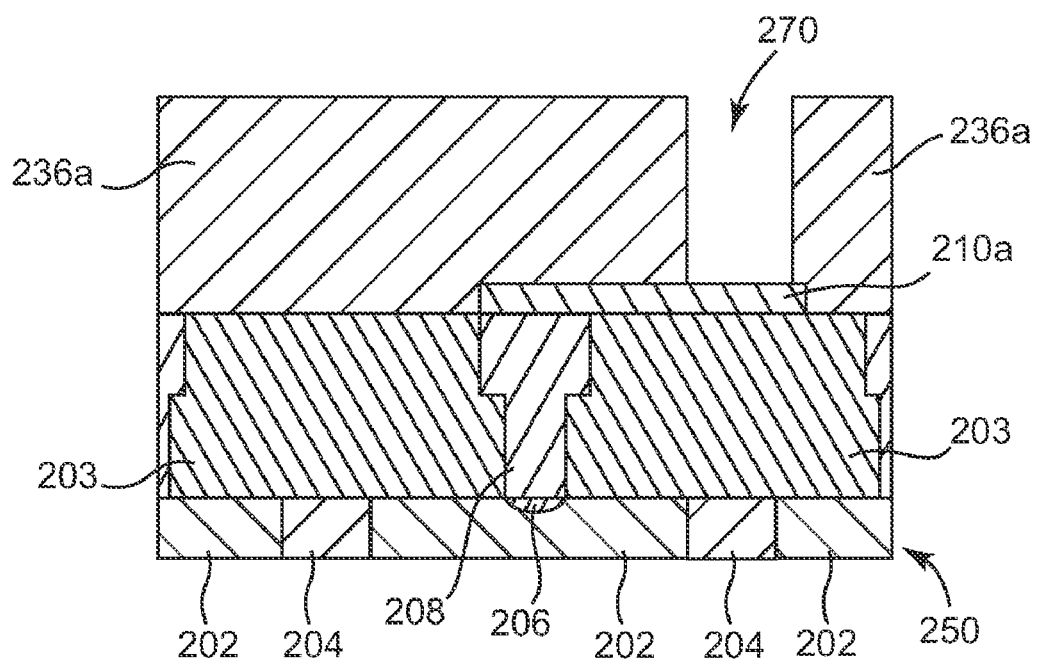
FIG. 7 illustrates a cross-sectional view of one embodiment of the preprocessed wafer, the metal pad, and a first dielectric material layer.

FIG. 7 illustrates a cross-sectional view of one embodiment of preprocessed wafer 250, metal pad 210a, and a first dielectric material layer 236a. A dielectric material, such as $SiO_2$, $SiO_x$, SiN, FSG, BPSG, BSG, or other suitable dielectric material is deposited over exposed portions of preprocessed wafer 250 and metal pad 210a to provide a dielectric material layer. The dielectric material layer is deposited using CVD, HDP-CVD, ALD, MOCVD, PVD, JVD, spin on, or other suitable deposition technique. The dielectric material layer is then etched to provide opening 270 exposing a portion of metal pad 210a and to provide first dielectric material layer 236a.

Figure 8:
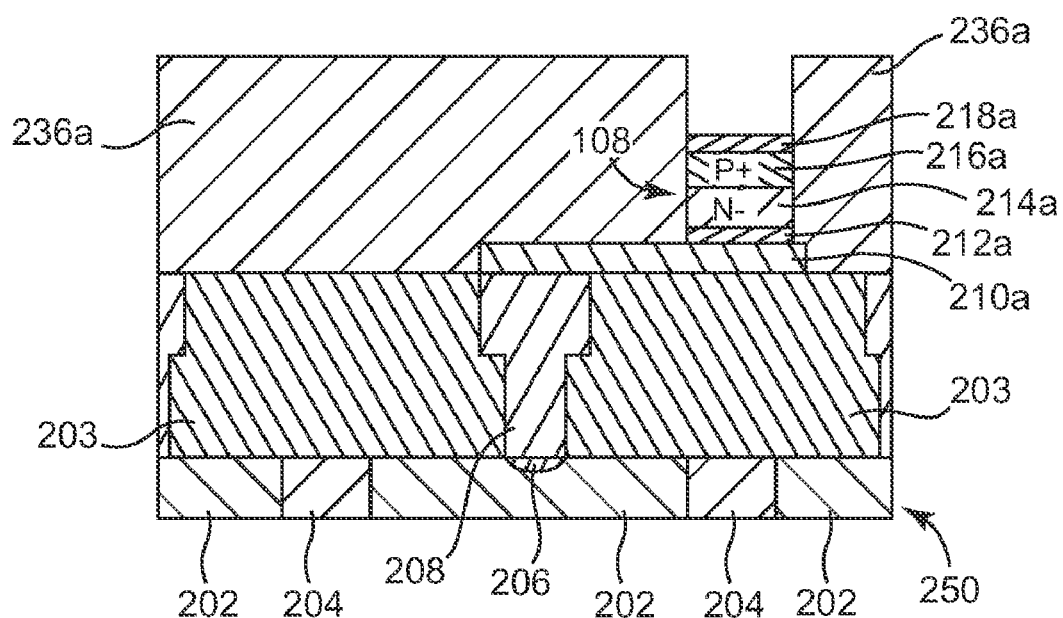
FIG. 8 illustrates a cross-sectional view of one embodiment of the preprocessed wafer, the metal pad, the first dielectric material layer, and a diode.

FIG. 8 illustrates a cross-sectional view of one embodiment of preprocessed wafer 250, metal pad 210a, first dielectric material layer 236a, and a diode 108. In one embodiment, opening 270 is filled with N− doped Si, which is etched back to provide a layer of N− doped Si on metal pad 210a. Opening 270 is then filled with P+ doped Si, which is etched back to provide a layer of P+ doped Si on the layer of N− doped Si. In another embodiment, opening 270 is filled with undoped Si, which is etched back and implanted to provide the layer of P+ doped Si on the layer of N− doped Si. In other embodiments, other suitable processes are used to provide the layer of P+ doped Si on the layer of N− doped Si. A metal layer is then deposited over the P+ doped Si layer for forming silicide. The layer of P+ doped Si and the layer of N− doped Si are then annealed to form first silicide contact 212a, N− region 214a, P+ region 216a, and second silicide contact 218a. N− region 214a and P+ region 216a provide diode 108. In another embodiment, the polarity of the diode is reversed.

Figure 9:
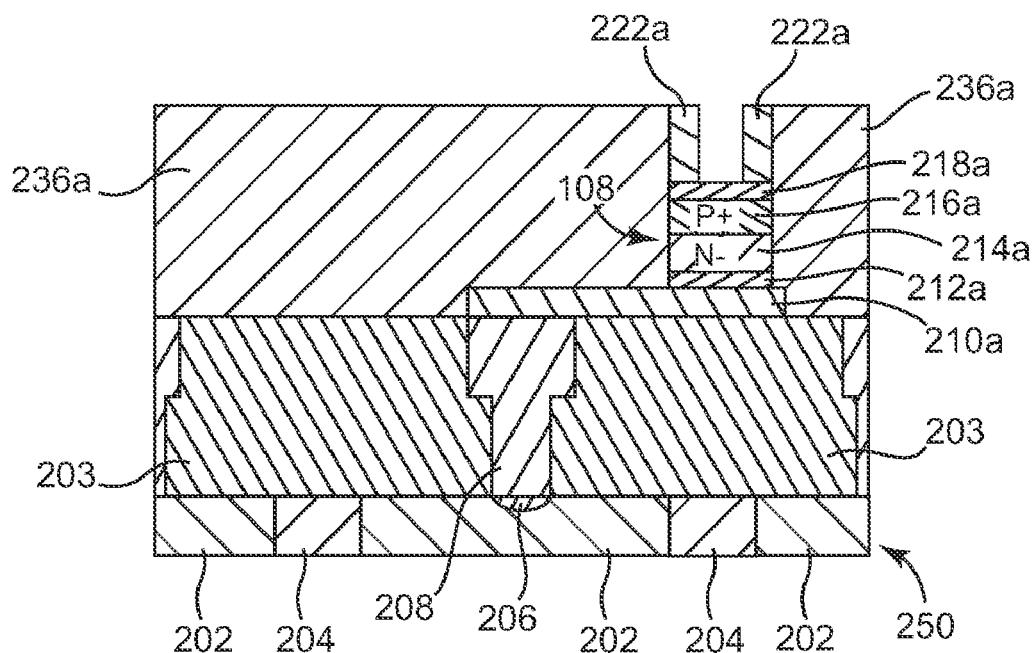
FIG. 9 illustrates a cross-sectional view of one embodiment of the preprocessed wafer, the metal pad, the first dielectric material layer, the diode, and spacers.

FIG. 9 illustrates a cross-sectional view of one embodiment of preprocessed wafer 250, metal pad 210a, first dielectric material layer 236a, diode 108, and spacers 222a. A spacer material, such as SiN, $SiO_2$, $SiO_xN$, $TaO_x$, $Al_2O_3$, or other suitable spacer material is conformally deposited over exposed portions of first dielectric material layer 236a and second silicide contact 218a to provide a spacer material layer. The spacer material layer is deposited using CVD, HDP-CVD, ALD, MOCVD, PVD, JVD, or other suitable deposition technique. The spacer material layer is then spacer etched to expose the top of first dielectric material layer 236a and a portion of second silicide contact 218a to provide spacers 222a.

Figure 10A:
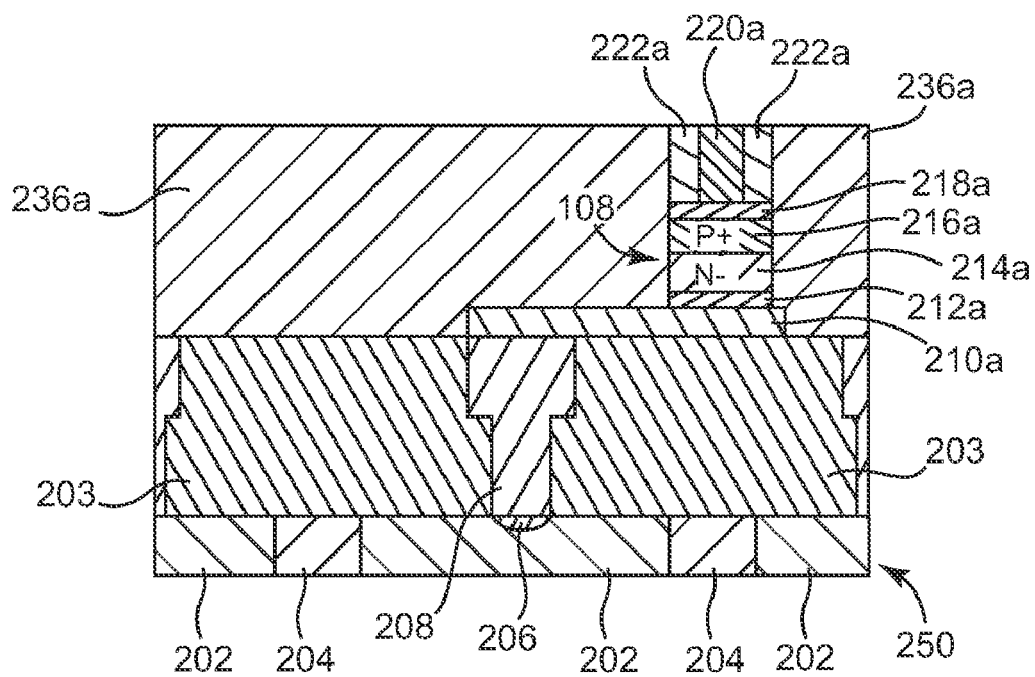
FIG. 10A illustrates a cross-sectional view of one embodiment of the preprocessed wafer, the metal pad, the first dielectric material layer, the diode, the spacers, and a bottom electrode.

FIG. 10A illustrates a cross-sectional view of one embodiment of preprocessed wafer 250, metal pad 210a, first dielectric material layer 236a, diode 108, spacers 222a, and a bottom electrode 220a. An electrode material, such as TiN, TaN, W, WN, Al, C, Ti, Ta, TiSiN, TaSiN, TiAlN, TaAlN, Cu, or other suitable electrode material is deposited over exposed portions of first dielectric material layer 236a, spacers 222a, and second silicide contact 218a to provide an electrode material layer. The electrode material layer is deposited using CVD, HDP-CVD, ALD, MOCVD, PVD, JVD, or other suitable deposition technique. The electrode material layer is then planarized to expose first dielectric material layer 236a and spacers 222a to provide bottom electrode 220a. The electrode material layer is planarized using CMP or another suitable planarization technique.

Figure 10B:
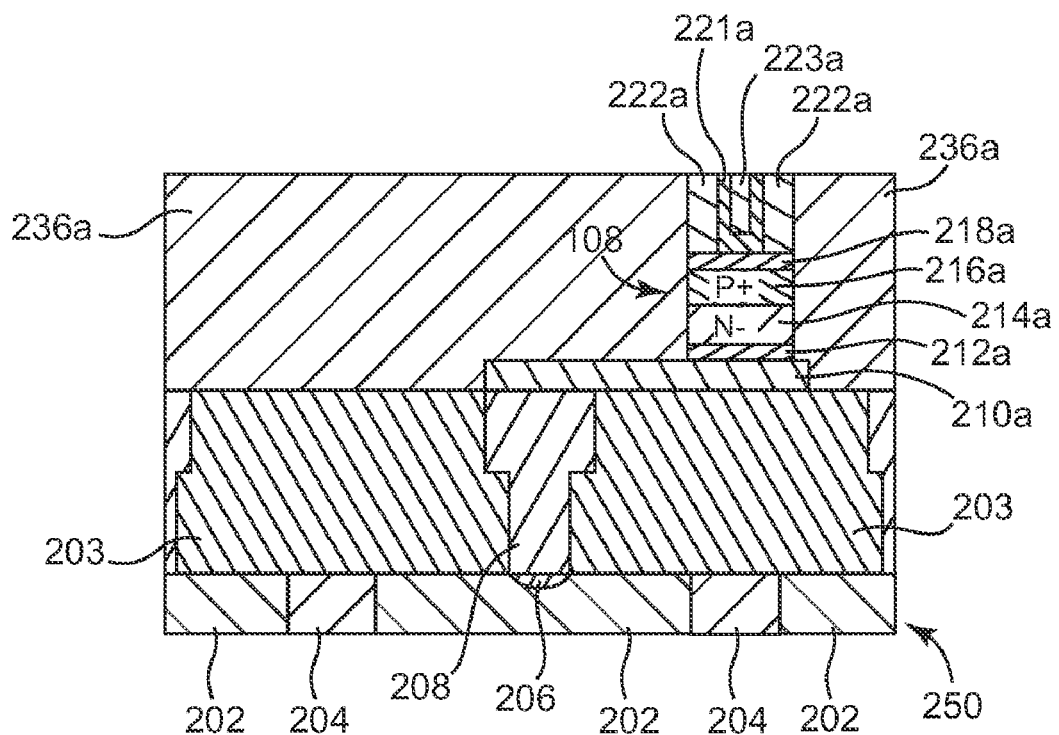
FIG. 10B illustrates a cross-sectional view of another embodiment of the preprocessed wafer, the metal pad, the first dielectric material layer, the diode, the spacers, a bottom electrode, and a semiconducting or dielectric material.

FIG. 10B illustrates a cross-sectional view of another embodiment of preprocessed wafer 250, metal pad 210a, first dielectric material layer 236a, diode 108, spacers 222a, a bottom electrode 221a, and a semiconducting or dielectric material 223a. An electrode material, such as TiN, TaN, W, WN, Al, C, Ti, Ta, TiSiN, TaSiN, TiAlN, TaAlN, Cu, or other suitable electrode material is conformally deposited over exposed portions of first dielectric material layer 236a, spacers 222a, and second silicide contact 218a to provide an electrode material layer. The electrode material layer is deposited using CVD, HDP-CVD, ALD, MOCVD, PVD, JVD, or other suitable deposition technique.

A semiconducting or dielectric material, such as Si, SiN, $SiO_2$, $SiO_xN$, $TaO_x$, $Al_2O_3$, or other suitable semiconducting or dielectric material is deposited over the electrode material layer to provide a semiconducting or dielectric material layer. The semiconducting or dielectric material layer is deposited using CVD, HDP-CVD, ALD, MOCVD, PVD, JVD, or other suitable deposition technique. The semiconducting or dielectric material layer and the electrode material layer are then planarized to expose first dielectric material layer 236a and spacers 222a to provide bottom electrode 221a and semiconducting or dielectric material 223a. The semiconducting or dielectric material layer and the electrode material layer are planarized using CMP or another suitable planarization technique.

Figure 11:
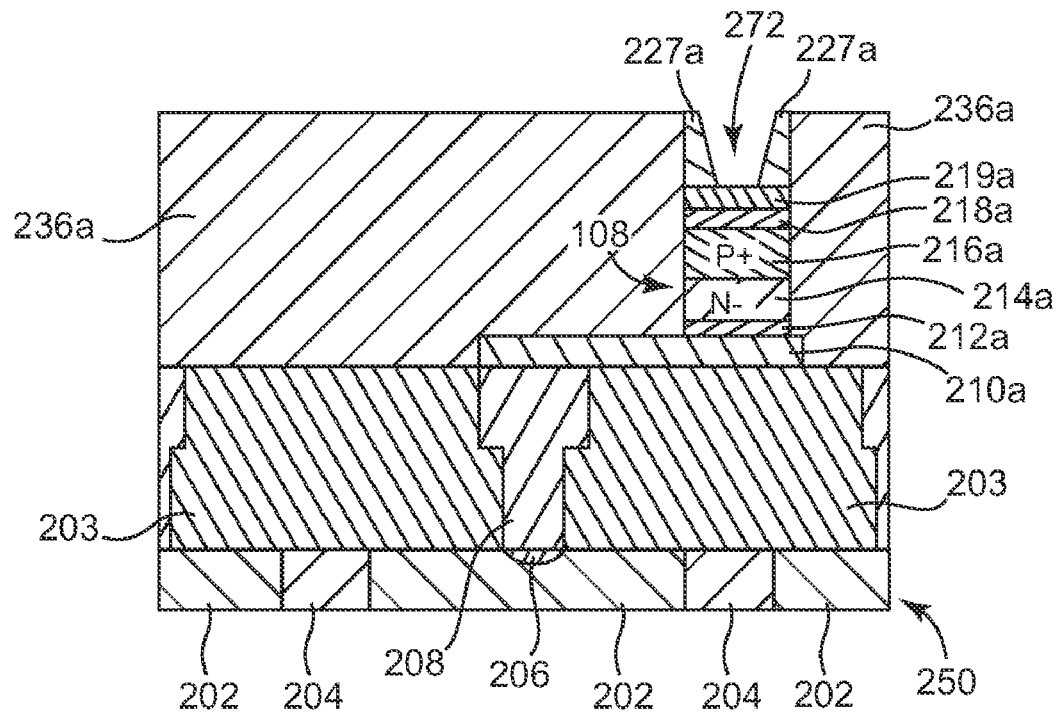
FIG. 11 illustrates a cross-sectional view of one embodiment of the preprocessed wafer, the metal pad, the first dielectric material layer, the diode, a bottom electrode, and a dielectric material.

FIG. 11 illustrates a cross-sectional view of one embodiment of preprocessed wafer 250, metal pad 210a, first dielectric material layer 236a, diode 108, a bottom electrode 219a, and a dielectric material 227a. The embodiments of the process described with reference to FIG. 11 follow the process previously described and illustrated with reference to FIG. 8. An electrode material, such as TiN, TaN, W, WN, Al, C, Ti, Ta, TiSiN, TaSiN, TiAlN, TaAlN, Cu, or other suitable electrode material is deposited over exposed portions of first dielectric material layer 236a and second silicide contact 218a to provide an electrode material layer. The electrode material layer is deposited using CVD, HDP-CVD, ALD, MOCVD, PVD, JVD, or other suitable deposition technique. The electrode material layer is then back etched to provide bottom electrode 219a.

A dielectric material, such as SiN, $SiO_2$, $SiO_xN$, $TaO_x$, $Al_2O_3$, or other suitable dielectric material is deposited over exposed portions of first dielectric material layer 236a and bottom electrode 219a to provide a dielectric material layer. The dielectric material layer is deposited using CVD, HDP-CVD, ALD, MOCVD, PVD, JVD, or other suitable deposition technique. The dielectric material layer is then planarized to expose first dielectric material layer 236a. The dielectric material layer is planarized using CMP or another suitable planarization technique. The remaining dielectric material filling opening 270 is then taper etched to provide tapered opening 272 exposing a portion of bottom electrode 219*a* and to provide dielectric material 227*a*.

Figure 12A:
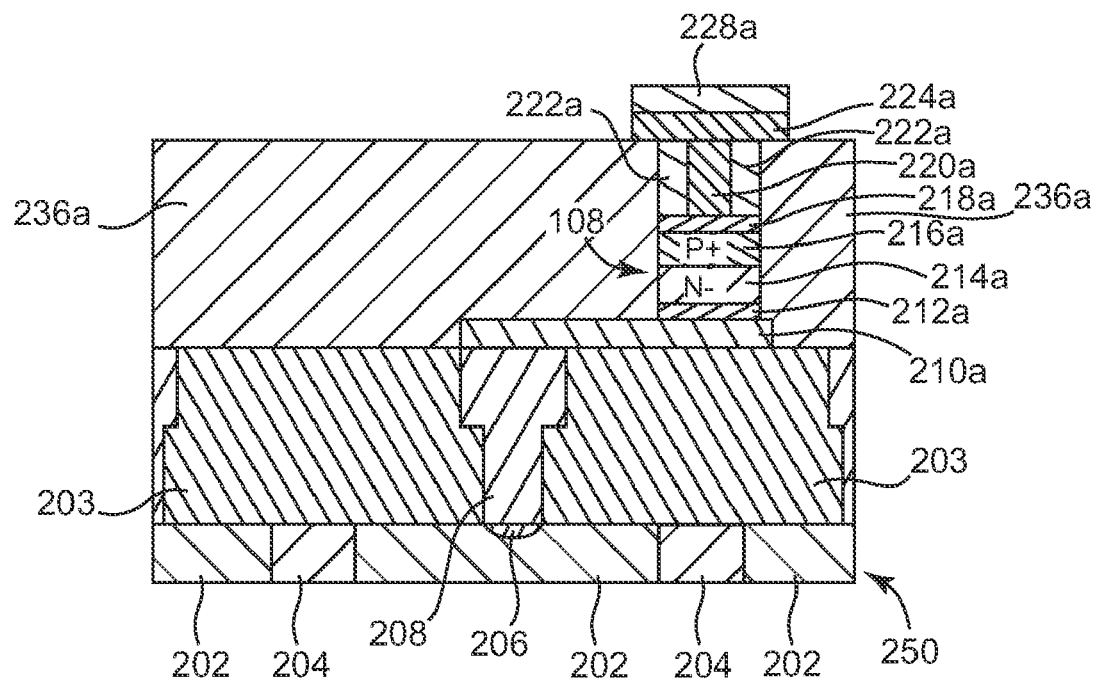
FIG. 12A illustrates a cross-sectional view of one embodiment of the preprocessed wafer, the metal pad, the first dielectric material layer, the diode, the spacers, the bottom electrode, a phase change material storage location, and a top electrode.

FIG. 12A illustrates a cross-sectional view of one embodiment of preprocessed wafer 250, metal pad 210*a*, first dielectric material layer 236*a*, diode 108, spacers 222*a*, bottom electrode 220*a*, a phase change material storage location 224*a*, and a top electrode 228*a*. The embodiments of the process described with reference to FIG. 12A follow the process previously described and illustrated with reference to FIG. 10A or 10B. A phase change material, such as a chalcogenide compound material or other suitable phase change material is deposited over exposed portions of first dielectric material layer 236*a*, spacers 222*a*, and bottom electrode 220*a* to provide a phase change material layer. The phase change material layer is deposited using CVD, HDP-CVD, ALD, MOCVD, PVD, JVD, or other suitable deposition technique.

An electrode material, such as TiN, TaN, W, WN, Al, C, Ti, Ta, TiSiN, TaSiN, TiAlN, TaAlN, Cu, or other suitable electrode material is deposited over the phase change material layer to provide an electrode material layer. The electrode material layer is deposited using CVD, HDP-CVD, ALD, MOCVD, PVD, JVD, or other suitable deposition technique. The electrode material layer and the phase change material layer are then etched to expose portions of first dielectric material layer 236*a* and to provide phase change material storage location 224*a* and top electrode 228*a*. In another embodiment, phase change material storage location 224*a* and top electrode 228*a* are fabricated using a damascene process.

Figure 12B:
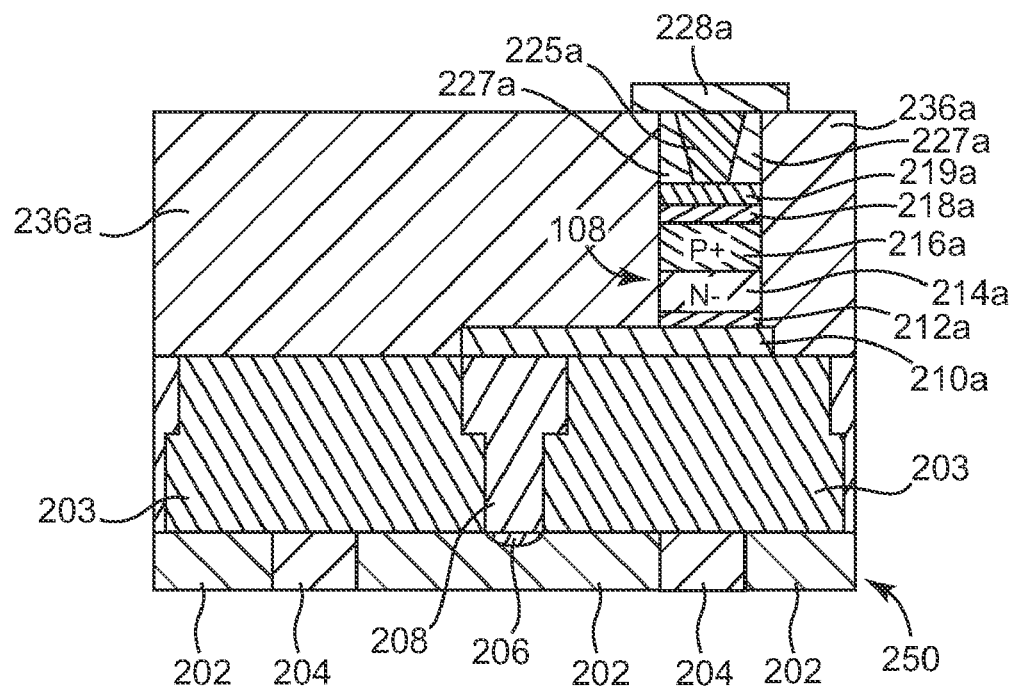
FIG. 12B illustrates a cross-sectional view of another embodiment of the preprocessed wafer, the metal pad, the first dielectric material layer, the diode, the bottom electrode, the dielectric material, a phase change material storage location, and a top electrode.

FIG. 12B illustrates a cross-sectional view of another embodiment of preprocessed wafer 250, metal pad 210*a*, first dielectric material layer 236*a*, diode 108, bottom electrode 219*a*, dielectric material 227*a*, a phase change material storage location 225*a*, and a top electrode 228*a*. The embodiments of the process described with reference to FIG. 12B follow the process previously described and illustrated with reference to FIG. 11. A phase change material, such as a chalcogenide compound material or other suitable phase change material is deposited over exposed portions of first dielectric material layer 236*a*, dielectric material 227*a*, and bottom electrode 219*a* to provide a phase change material layer. The phase change material layer is deposited using CVD, HDP-CVD, ALD, MOCVD, PVD, JVD, or other suitable deposition technique. The phase change material layer is then planarized to expose first dielectric material layer 236*a* and dielectric material 227*a* to provide phase change material storage location 225*a*. The phase change material layer is planarized using CMP or another suitable planarization technique.

An electrode material, such as TiN, TaN, W, WN, Al, C, Ti, Ta, TiSiN, TaSiN, TiAlN, TaAlN, Cu, or other suitable electrode material is deposited over first dielectric material layer 236*a*, dielectric material 227*a*, and phase change material storage location 225*a* to provide an electrode material layer. The electrode material layer is deposited using CVD, HDP-CVD, ALD, MOCVD, PVD, JVD, or other suitable deposition technique. The electrode material layer is then etched to expose portions of first dielectric material layer 236*a* and to provide top electrode 228*a*. In another embodiment, top electrode 228*a* is fabricated using a damascene process.

While the remaining FIGS. 13-16 illustrate embodiments for fabricating stacked diode memory cells 200*a* following the process previously described and illustrated with reference to FIG. 12A, a similar process can be used to fabricate stacked diode memory cells 200*b* and 200*c*.

Figure 13:
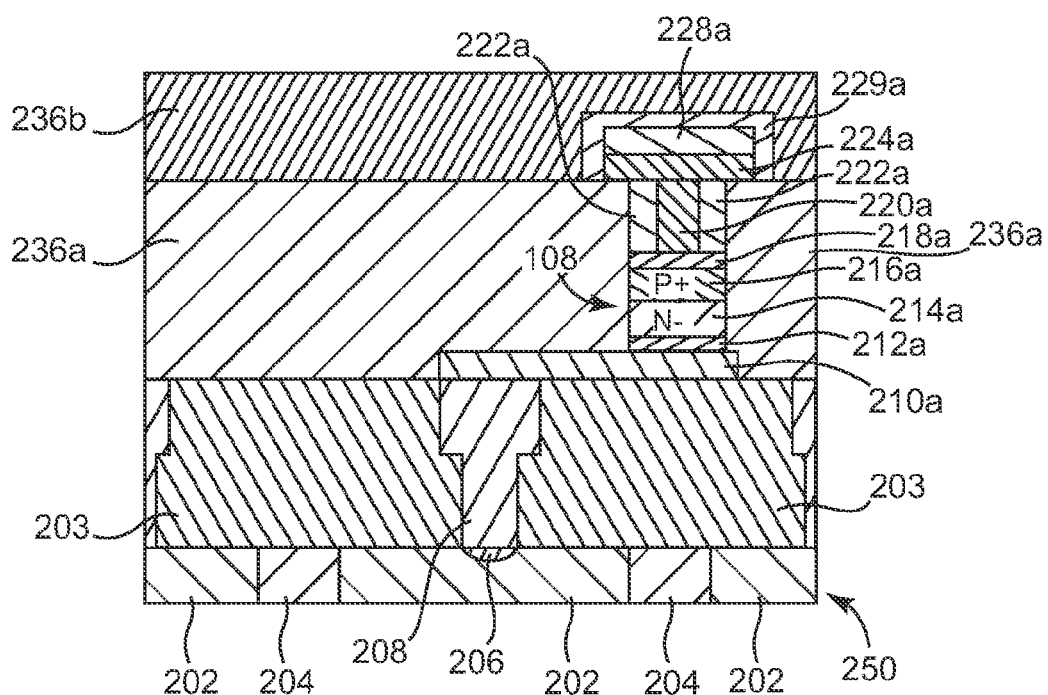
FIG. 13 illustrates a cross-sectional view of one embodiment of the preprocessed wafer, the metal pad, the first dielectric material layer, the diode, the spacers, the bottom electrode, the phase change material storage location, the top electrode, an encapsulation material, and a second dielectric material layer.

FIG. 13 illustrates a cross-sectional view of one embodiment of preprocessed wafer 250, metal pad 210*a*, first dielectric material layer 236*a*, diode 108, spacers 222*a*, bottom electrode 220*a*, phase change material storage location 224*a*, top electrode 228*a*, an encapsulation material 229*a*, and a second dielectric material layer 236*b*. An encapsulation material, such as SiN, SiON, $TaO_x$, $Al_2O_3$, or other suitable encapsulation material is conformally deposited over exposed portions of first dielectric material layer 236*a*, phase change material storage location 224*a*, and top electrode 228*a* to provide an encapsulation material layer. The encapsulation material layer is deposited using CVD, HDP-CVD, ALD, MOCVD, PVD, JVD, or other suitable deposition technique. The encapsulation material layer is then etched to expose portions of first dielectric material layer 236*a* to provide encapsulation material 229*a*.

A dielectric material, such as $SiO_2$, $SiO_x$, SiN, FSG, BPSG, BSG, or other suitable dielectric material is deposited over exposed portions of first dielectric material layer 236*a* and encapsulation material 229*a* to provide a dielectric material layer. The dielectric material layer is deposited using CVD, HDP-CVD, ALD, MOCVD, PVD, JVD, or other suitable deposition technique. The dielectric material layer is then planarized to provide second dielectric material layer 236*b*. The dielectric material layer is planarized using CMP or another suitable planarization technique.

Figure 14:
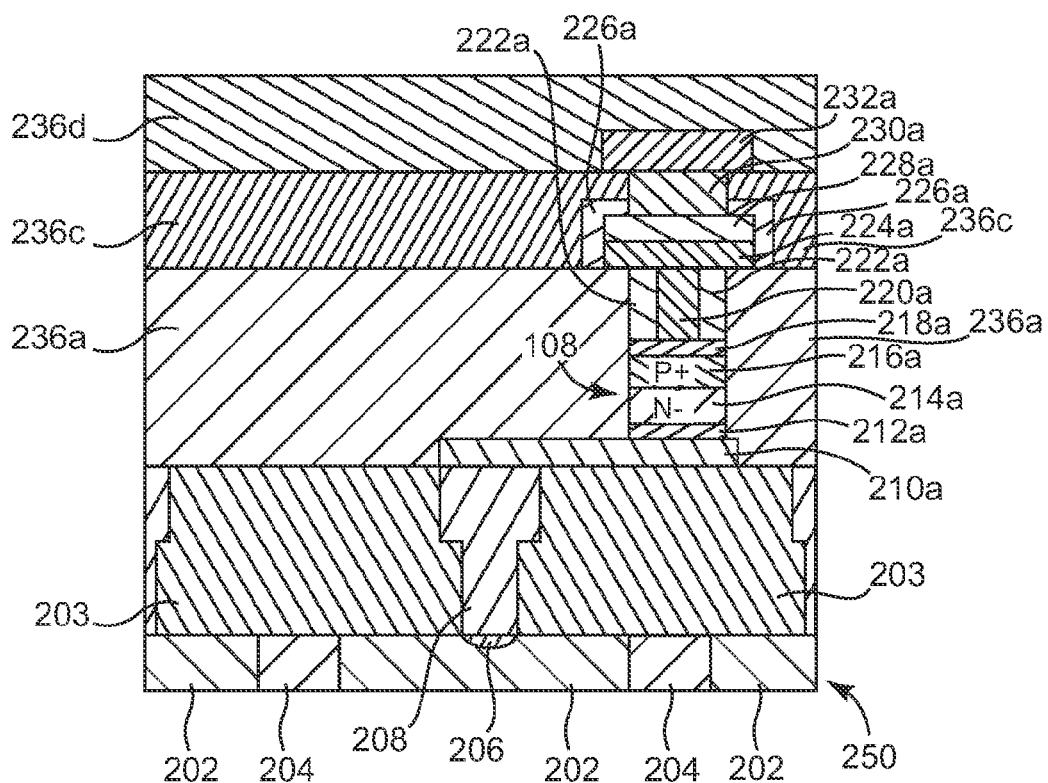
FIG. 14 illustrates a cross-sectional view of one embodiment of the preprocessed wafer, the metal pad, the first dielectric material layer, the diode, the spacers, the bottom electrode, the phase change material storage location, the top electrode, the encapsulation material, the second dielectric material layer, a bit line contact, a bit line, and a third dielectric material layer.

FIG. 14 illustrates a cross-sectional view of one embodiment of preprocessed wafer 250, metal pad 210*a*, first dielectric material layer 236*a*, diode 108, spacers 222*a*, bottom electrode 220*a*, phase change material storage location 224*a*, top electrode 228*a*, encapsulation material 226*a*, second dielectric material layer 236*c*, a bit line contact 230*a*, a bit line 232*a*, and a third dielectric material layer 236*d*. Second dielectric material layer 236*b* and encapsulation material 229*a* are etched to provide an opening exposing a portion top electrode 228*a* and to provide encapsulation material 226*a* and second dielectric material layer 236*c*.

A contact material, such as W, Al, Cu, or other suitable contact material is deposited over exposed portions of second dielectric material layer 236*c*, encapsulation material 226*a*, and top electrode 228*a* to provide a contact material layer. The contact material layer is deposited using CVD, HDP-CVD, ALD, MOCVD, PVD, JVD, or other suitable deposition technique. The contact material layer is then planarized to expose second dielectric material layer 236*c* to provide bit line contact 230*a*. The contact material layer is planarized using CMP or another suitable planarization technique.

A metal, such as W, Al, Cu, or other suitable metal is deposited over second dielectric material layer 236*c* and bit line contact 230*a* to provide a metal layer. The metal layer is deposited using CVD, HDP-CVD, ALD, MOCVD, PVD, JVD, or other suitable deposition technique. The metal layer is then etched to expose portions of second dielectric material layer 236*c* to provide bit line 232*a*. In another embodiment, bit line 232*a* is fabricated using a damascene process.

A dielectric material, such as $SiO_2$, $SiO_x$, SiN, FSG, BPSG, BSG, or other suitable dielectric material is deposited over exposed portions of second dielectric material layer 236*c* and bit line 232*a* to provide a dielectric material layer. The dielectric material layer is deposited using CVD, HDP-CVD, ALD, MOCVD, PVD, JVD, or other suitable deposition technique. The dielectric material layer is then planarized to provide third dielectric material layer 236*d*. The dielectric material layer is planarized using CMP or another suitable planarization technique.

Figure 15:
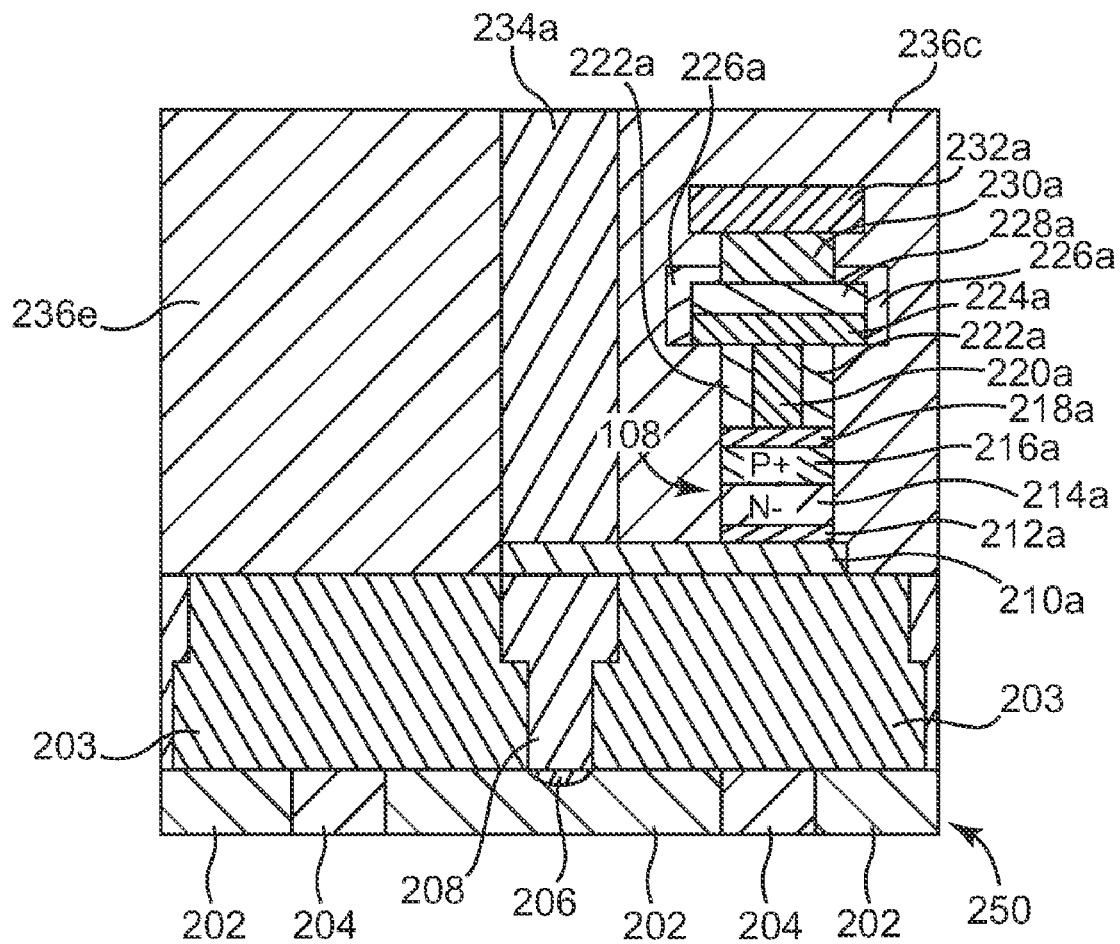
FIG. 15 illustrates a cross-sectional view of one embodiment of the preprocessed wafer, the metal pad, dielectric material, the diode, the spacers, the bottom electrode, the phase change material storage location, the top electrode, the encapsulation material, the bit line contact, the bit line, and a vertical contact.

FIG. 15 illustrates a cross-sectional view of one embodiment of preprocessed wafer 250, metal pad 210a, dielectric material 236e, diode 108, spacers 222a, bottom electrode 220a, phase change material storage location 224a, top electrode 228a, encapsulation material 226a, bit line contact 230a, bit line 232a, and a vertical contact 234a. Third dielectric material layer 236d, second dielectric material layer 236c, and first dielectric material layer 236a are etched to provide an opening exposing a portion of metal pad 210a. The remaining portions of third dielectric material layer 236d, second dielectric material layer 236c, and first dielectric material layer 236a are collectively referred to as dielectric material 236e.

A contact material, such as W, Al, Cu, or other suitable contact material is deposited over exposed portions of dielectric material 236e and metal pad 210a to provide a contact material layer. The contact material layer is deposited using CVD, HDP-CVD, ALD, MOCVD, PVD, JVD, or other suitable deposition technique. The contact material layer is then planarized to expose dielectric material 236e to provide vertical contact 234a. The contact material layer is planarized using CMP or another suitable planarization technique.

Figure 16:
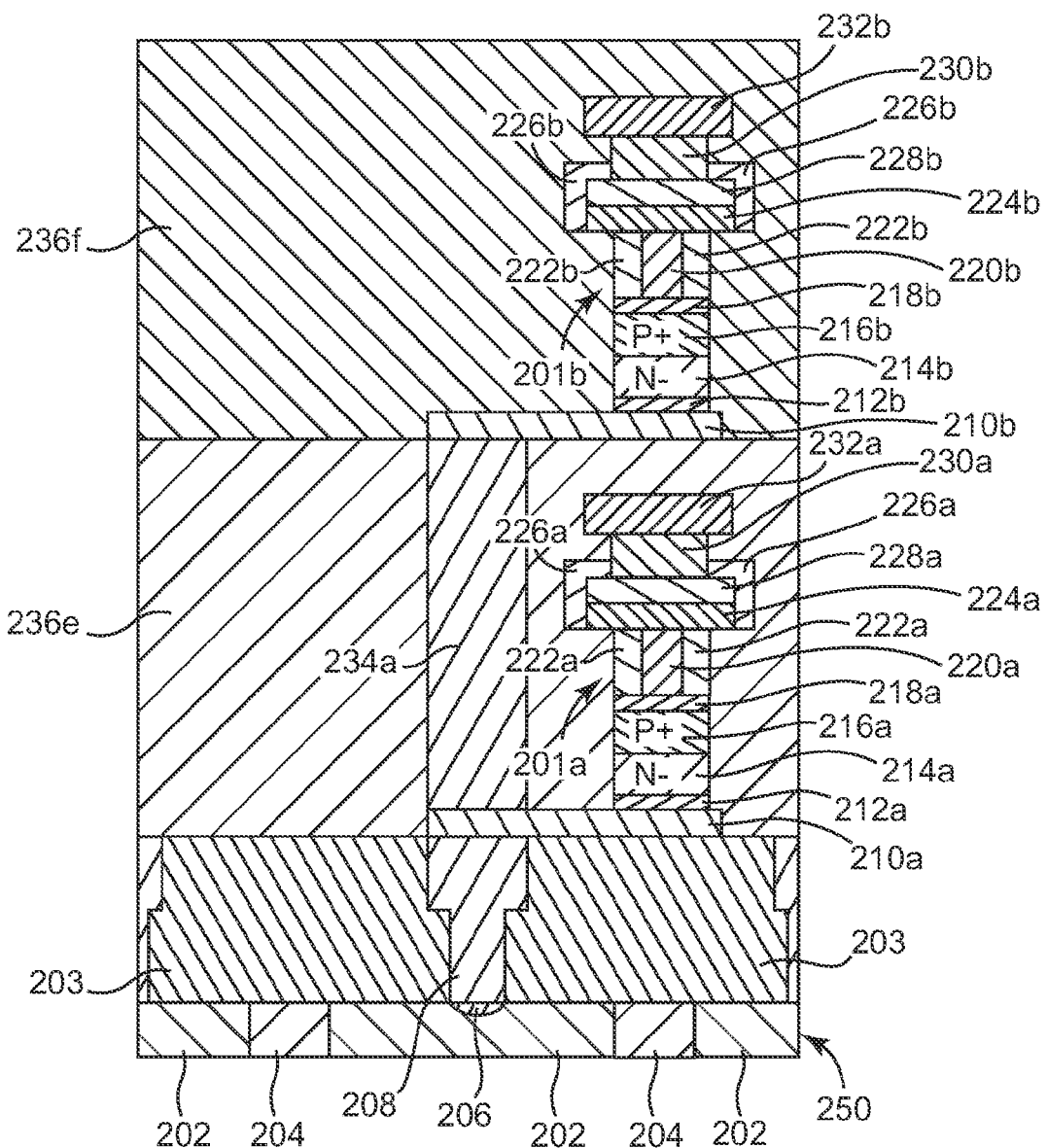
FIG. 16 illustrates a cross-sectional view of one embodiment of the preprocessed wafer, metal pads, the vertical contact, dielectric material, diode phase change memory cells, and bit lines.

FIG. 16 illustrates a cross-sectional view of one embodiment of preprocessed wafer 250, metal pads 210a and 210b, vertical contact 234a, dielectric material 236e and 336f, diode phase change memory cells 201a and 201b, and bit lines 232a and 232b. A process similar to the process previously described and illustrated with reference to FIGS. 6A-14 is repeated over dielectric material 236e and vertical contact 234a to provide metal pad 210b, diode phase change memory cell 201b, bit line 232b, and dielectric material 236f. To add additional diode phase change memory cells over diode phase change memory cell 201b, an additional contact 234b is fabricated in dielectric material 236f using a similar process as previously described and illustrated with reference to FIG. 15. A stack of any suitable number of diode phase change memory cells may be fabricated.

Embodiments provide stacked diode phase change memory cells to provide a three dimensional array of diode phase change memory cells. Each memory cell in a stack is accessed via a transistor formed in the substrate below the stack. The three dimensional array of diode memory cells allow for a reduction in leakage current requirements compared to two dimensional arrays having a similar number of memory cells. The reduction in leakage current requirements enables the use of polysilicon diodes, which simplifies the fabrication process and therefore reduces the cost.

While the specific embodiments described herein substantially focused on using phase change memory elements, the present invention can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. An integrated circuit comprising:
a transistor formed in a substrate;
a contact coupled to the transistor;
a first diode resistivity changing material memory cell coupled to the contact; and
a second diode resistivity changing material memory cell coupled to the contact,
wherein the first diode resistivity changing material memory cell is positioned between the second diode resistivity changing material memory cell and the substrate.

2. The integrated circuit of claim 1, wherein the first diode resistivity changing material memory cell comprises:
a polysilicon diode; and
a resistivity changing material coupled to the polysilicon diode.

3. The integrated circuit of claim 1, wherein the first diode resistivity changing material memory cell comprises a first diode phase change memory cell.

4. The integrated circuit of claim 1, wherein the transistor comprises a field effect transistor.

5. The integrated circuit of claim 1, further comprising:
a first bit line coupled to the first diode resistivity changing material memory cell;
a second bit line coupled to the second diode resistivity changing material memory cell;
a word line coupled to a gate of the transistor; and
a ground line coupled to the transistor opposite the contact.

6. The integrated circuit of claim 5, wherein the word line is parallel to the ground line.

7. The integrated circuit of claim 5, wherein the first bit line and the second bit line are parallel to the ground line.

8. The integrated circuit of claim 5, wherein the first bit line and the second bit line are perpendicular to the word line, and wherein the ground line is diagonal to the first bit line, the second bit line, and the word line.

9. An integrated circuit comprising:
an access transistor formed in a substrate;
a vertical contact coupled to the transistor;
a first diode resistive memory cell coupled to the vertical contact; and
a second diode resistive memory cell coupled to the vertical contact,
wherein the first diode resistive memory cell is located between the second diode resistive memory cell and the substrate.

10. The integrated circuit of claim 9, wherein the first diode resistive memory cell comprises a first polysilicon diode, and wherein the second diode resistive memory cell comprises a second polysilicon diode.

11. The integrated circuit of claim 9, wherein the transistor comprises a field effect transistor.

12. The integrated circuit of claim 9, further comprising:
a third diode resistive memory cell coupled to the vertical contact,
wherein the second diode resistive memory cell is located between the third diode resistive memory cell and the substrate.

13. The integrated circuit of claim 9, wherein the first diode resistive memory cell comprises a first diode phase change memory cell, and
wherein the second diode resistive memory cell comprises a second diode phase change memory cell.

14. The integrated circuit of claim 9, further comprising:
a first bit line coupled to the first diode resistive memory cell;
a second bit line coupled to the second diode resistive memory cell;
a word line coupled to a gate of the transistor; and
a ground line coupled to the transistor opposite the contact.

15. The integrated circuit of claim 14, wherein the word line is parallel to the ground line.

16. The integrated circuit of claim 14, wherein the first bit line and the second bit line are parallel to the ground line.

17. The integrated circuit of claim 14, wherein the first bit line and the second bit line are perpendicular to the word line, and wherein the ground line is diagonal to the first bit line, the second bit line, and the word line.

18. An integrated circuit comprising:

a first diode;

a first phase change element coupled to the first diode;

a second diode;

a second phase change element coupled to the second diode; and a transistor configured to access the first phase change element and the second phase change element, wherein the second diode and the second phase change element are stacked over the first diode and the first phase change element.

19. The integrated circuit of claim 18, further comprising:

a vertical contact electrically coupled to the transistor, the first diode, and the second diode.

20. The integrated circuit of claim 19, further comprising:

a first metal pad electrically coupling the vertical contact to the first diode, the first metal pad perpendicular to the vertical contact; and a second metal pad electrically coupling the vertical contact to the second diode, the second metal pad perpendicular to the vertical contact.

21. The integrated circuit of claim 18, wherein the first phase change element comprises:

a first electrode;

a second electrode; and phase change material contacting the first electrode and the second electrode, the phase change material having a greater cross-sectional width than the first electrode.

22. The integrated circuit of claim 18, wherein the first phase change element comprises:

a first ring electrode;

a second electrode; and phase change material contacting the first ring electrode and the second electrode.

23. The integrated circuit of claim 18, wherein the first phase change element comprises:

a first electrode;

a second electrode; and phase change material contacting the first electrode and the second electrode, the phase change material including tapered sidewalls.

24. The integrated circuit of claim 18, further comprising:

a first bit line coupled to the first phase change element;

a second bit line coupled to the second phase change element;

a word line coupled to a gate of the transistor; and a ground line coupled to a source-drain path of the transistor.

25. The integrated circuit of claim 24, wherein the word line is parallel to the ground line.

26. The integrated circuit of claim 24, wherein the first bit line and the second bit line are parallel to the ground line.

27. The integrated circuit of claim 24, wherein the first bit line and the second bit line are perpendicular to the word line, and wherein the ground line is diagonal to the first bit line, the second bit line, and the word line.

* * * * *